(12) United States Patent
Goodson et al.

(10) Patent No.: US 7,104,312 B2
(45) Date of Patent: Sep. 12, 2006

(54) METHOD AND APPARATUS FOR ACHIEVING TEMPERATURE UNIFORMITY AND HOT SPOT COOLING IN A HEAT PRODUCING DEVICE

(75) Inventors: Kenneth Goodson, Belmont, CA (US); Thomas Kenny, San Carlos, CA (US); Peng Zhou, Albany, CA (US); Girish Upadhya, Mountain View, CA (US); Mark Munch, Los Altos, CA (US); Mark McMaster, Palo Alto, CA (US); James Horn, Redwood City, CA (US)

(73) Assignee: Cooligy, Inc., Mountain View, CA (US)

( * ) Notice: Subject to any disclaimer, the term of this patent is extended or adjusted under 35 U.S.C. 154(b) by 175 days.

(21) Appl. No.: 10/698,304

(22) Filed: Oct. 30, 2003

(65) Prior Publication Data

US 2004/0112585 A1   Jun. 17, 2004

Related U.S. Application Data

(60) Provisional application No. 60/462,245, filed on Apr. 11, 2003, provisional application No. 60/423,009, filed on Nov. 1, 2002, provisional application No. 60/442,383, filed on Jan. 24, 2003, and provisional application No. 60/455,729, filed on Mar. 17, 2003.

(51) Int. Cl.
   *F28F 7/00* (2006.01)

(52) U.S. Cl. .............................. 165/80.4; 165/104.33; 361/699; 257/715; 174/15.1

(58) Field of Classification Search ........................ None
   See application file for complete search history.

(56) References Cited

U.S. PATENT DOCUMENTS

| ,596,062 A | 12/1897 | Firey |
|---|---|---|
| 2,039,593 A | 5/1936 | Hubbuch et al. |
| 2,273,505 A | 2/1942 | Florian |
| 3,361,195 A | 1/1968 | Meyerhoff et al. |

(Continued)

FOREIGN PATENT DOCUMENTS

| CN | 97212126.9 | 3/1997 |
|---|---|---|
| JP | 10-99592 | 4/1998 |
| JP | 2000-277540 | 10/2000 |
| JP | 2001-326311 | 11/2001 |

OTHER PUBLICATIONS

Stephen C. Jacobson et al., "Fused Quartz Substrates for Microchip Electrophoresis", Analytical Chemistry, Vo. 67, No. 13, Jul. 1, 1995, pp. 2059–2063.

Kendra V. Sharp et al., "Liquid Flows in Microchannels", 2002, vol. 6, pp. 6–1 to 6–38.

(Continued)

*Primary Examiner*—Terrell Mckinnon
(74) *Attorney, Agent, or Firm*—Haverstock & Owens LLP

(57) ABSTRACT

A method of controlling temperature of a heat source in contact with a heat exchanging surface of a heat exchanger, wherein the heat exchanging surface is substantially aligned along a plane. The method comprises channeling a first temperature fluid to the heat exchanging surface, wherein the first temperature fluid undergoes thermal exchange with the heat source along the heat exchanging surface. The method comprises channeling a second temperature fluid from the heat exchange surface, wherein fluid is channeled to minimize temperature differences along the heat source. The temperature differences are minimized by optimizing and controlling the fluidic and thermal resistances in the heat exchanger. The resistances to the fluid are influenced by size, volume and surface area of heat transferring features, multiple pumps, fixed and variable valves and flow impedance elements in the fluid path, pressure and flow rate control of the fluid, and other factors.

165 Claims, 15 Drawing Sheets

U.S. PATENT DOCUMENTS

| | | |
|---|---|---|
| 3,654,988 A | 4/1972 | Clayton, III |
| 3,771,219 A | 11/1973 | Tuzi et al. |
| 3,817,321 A | 6/1974 | von Cube et al. |
| 3,823,572 A | 7/1974 | Cochran, Jr. |
| 3,923,426 A | 12/1975 | Theeuwes |
| 3,929,154 A | 12/1975 | Goodwin |
| 3,948,316 A | 4/1976 | Souriau |
| 4,109,707 A | 8/1978 | Wilson et al. |
| 4,194,559 A | 3/1980 | Eastman |
| 4,211,208 A | 7/1980 | Lindner |
| 4,248,295 A | 2/1981 | Ernst et al. |
| 4,312,012 A | 1/1982 | Frieser et al. |
| 4,450,472 A | 5/1984 | Tuckerman et al. |
| 4,467,861 A | 8/1984 | Kiseev et al. |
| 4,485,429 A | 11/1984 | Mittal |
| 4,516,632 A | 5/1985 | Swift et al. |
| 4,540,115 A | 9/1985 | Hawrylo |
| 4,561,040 A | 12/1985 | Eastman et al. |
| 4,567,505 A | 1/1986 | Pease et al. |
| 4,573,067 A | 2/1986 | Tuckerman et al. |
| 4,574,876 A | 3/1986 | Aid |
| 4,644,385 A | 2/1987 | Nakanishi et al. |
| 4,664,181 A | 5/1987 | Sumberg |
| 4,758,926 A | 7/1988 | Herrell et al. |
| 4,866,570 A | 9/1989 | Porter |
| 4,868,712 A | 9/1989 | Woodman |
| 4,893,174 A | 1/1990 | Yamada et al. |
| 4,894,709 A | 1/1990 | Phillips et al. |
| 4,896,719 A | 1/1990 | O'Neill et al. |
| 4,903,761 A | 2/1990 | Cima |
| 4,908,112 A | 3/1990 | Pace |
| 4,938,280 A | 7/1990 | Clark |
| 5,009,760 A | 4/1991 | Zare et al. |
| 5,016,090 A | 5/1991 | Galyon et al. |
| 5,016,138 A | 5/1991 | Woodman |
| 5,043,797 A | 8/1991 | Lopes |
| 5,057,908 A | 10/1991 | Weber |
| 5,058,627 A | 10/1991 | Brannen |
| 5,070,040 A | 12/1991 | Pankove |
| 5,083,194 A | 1/1992 | Bartilson |
| 5,088,005 A | 2/1992 | Ciaccio |
| 5,096,388 A | 3/1992 | Weinberg |
| 5,099,311 A | 3/1992 | Bonde et al. |
| 5,099,910 A | 3/1992 | Walpole et al. |
| 5,125,451 A | 6/1992 | Matthews |
| 5,131,233 A | 7/1992 | Cray et al. |
| 5,161,089 A | 11/1992 | Chu et al. |
| 5,179,500 A | 1/1993 | Koubek et al. ............ 361/385 |
| 5,203,401 A | 4/1993 | Hamburgen et al. |
| 5,218,515 A | 6/1993 | Bernhardt |
| 5,219,278 A | 6/1993 | Van Lintel |
| 5,228,502 A | 7/1993 | Chu et al. |
| 5,230,564 A | 7/1993 | Bartilson et al. |
| 5,232,047 A | 8/1993 | Matthews |
| 5,239,200 A | 8/1993 | Messina et al. |
| 5,239,443 A | 8/1993 | Fahey et al. |
| 5,263,251 A | 11/1993 | Matthews |
| 5,265,670 A | 11/1993 | Zingher |
| 5,269,372 A | 12/1993 | Chu et al. |
| 5,274,920 A | 1/1994 | Matthews |
| 5,275,237 A | 1/1994 | Rolfson et al. |
| 5,281,026 A | 1/1994 | Bartilson et al. |
| 5,308,429 A | 5/1994 | Bradley |
| 5,309,319 A | 5/1994 | Messina |
| 5,310,440 A | 5/1994 | Zingher |
| 5,316,077 A | 5/1994 | Reichard |
| 5,317,805 A | 6/1994 | Hoopman et al. |
| 5,325,265 A | 6/1994 | Turlik et al. |
| 5,336,062 A | 8/1994 | Richter |
| 5,346,000 A | 9/1994 | Schlitt |
| 5,380,956 A | 1/1995 | Loo et al. |
| 5,383,340 A | 1/1995 | Larson et al. |
| 5,386,143 A | 1/1995 | Fitch |
| 5,388,635 A | 2/1995 | Gruber et al. |
| 5,421,943 A | 6/1995 | Tam et al. |
| 5,427,174 A | 6/1995 | Lomolino, Sr. et al. |
| 5,436,793 A | 7/1995 | Sanwo et al. |
| 5,459,099 A | 10/1995 | Hsu |
| 5,490,117 A | 2/1996 | Oda et al. |
| 5,508,234 A | 4/1996 | Dusablon, Sr. et al. |
| 5,514,832 A | 5/1996 | Dusablon, Sr. et al. |
| 5,514,906 A | 5/1996 | Love et al. |
| 5,544,696 A | 8/1996 | Leland |
| 5,548,605 A | 8/1996 | Benett et al. |
| 5,575,929 A | 11/1996 | Yu et al. |
| 5,579,828 A | 12/1996 | Reed et al. |
| 5,585,069 A | 12/1996 | Zanzucchi et al. |
| 5,641,400 A | 6/1997 | Kaltenbach et al. |
| 5,658,831 A | 8/1997 | Layton et al. |
| 5,675,473 A | 10/1997 | McDunn et al. |
| 5,692,558 A | 12/1997 | Hamilton et al. |
| 5,696,405 A | 12/1997 | Weld |
| 5,703,536 A | 12/1997 | Davis et al. |
| 5,704,416 A | 1/1998 | Larson et al. |
| 5,727,618 A | 3/1998 | Mundinger et al. |
| 5,740,013 A | 4/1998 | Roesner et al. |
| 5,759,014 A | 6/1998 | Van Lintel |
| 5,763,951 A | 6/1998 | Hamilton et al. |
| 5,768,104 A | 6/1998 | Salmonson et al. |
| 5,774,779 A | 6/1998 | Tuchinskiy |
| 5,800,690 A | 9/1998 | Chow et al. |
| 5,801,442 A | 9/1998 | Hamilton et al. |
| 5,835,345 A | 11/1998 | Staskus et al. |
| 5,836,750 A | 11/1998 | Cabuz |
| 5,858,188 A | 1/1999 | Soane et al. |
| 5,863,708 A | 1/1999 | Zanzucchi et al. |
| 5,869,004 A | 2/1999 | Parce et al. |
| 5,870,823 A | 2/1999 | Bezama et al. |
| 5,874,795 A | 2/1999 | Sakamoto |
| 5,876,655 A | 3/1999 | Fisher |
| 5,880,017 A | 3/1999 | Schwiebert et al. |
| 5,880,524 A | 3/1999 | Xie |
| 5,901,037 A | 5/1999 | Hamilton et al. |
| 5,921,087 A | 7/1999 | Bhatia et al. |
| 5,936,192 A | 8/1999 | Tauchi |
| 5,940,270 A | 8/1999 | Puckett |
| 5,942,093 A | 8/1999 | Rakestraw et al. |
| 5,945,217 A | 8/1999 | Hanrahan |
| 5,964,092 A | 10/1999 | Tozuka et al. |
| 5,965,001 A | 10/1999 | Chow et al. |
| 5,965,813 A | 10/1999 | Wan et al. |
| 5,978,220 A | 11/1999 | Frey et al. |
| 5,993,750 A | 11/1999 | Ghosh et al. |
| 5,997,713 A | 12/1999 | Beetz, Jr. et al. |
| 5,998,240 A | 12/1999 | Hamilton et al. |
| 6,007,309 A | 12/1999 | Hartley |
| 6,010,316 A | 1/2000 | Haller et al. |
| 6,013,164 A | 1/2000 | Paul et al. |
| 6,019,165 A | 2/2000 | Batchelder |
| 6,019,882 A | 2/2000 | Paul et al. |
| 6,034,872 A | 3/2000 | Chrysler et al. |
| 6,039,114 A | 3/2000 | Becker et al. |
| 6,054,034 A | 4/2000 | Soane et al. |
| 6,068,752 A | 5/2000 | Dubrow et al. |
| 6,090,251 A | 7/2000 | Sundberg et al. |
| 6,096,656 A | 8/2000 | Matzke et al. |
| 6,100,541 A | 8/2000 | Nagle et al. |
| 6,101,715 A | 8/2000 | Fuesser et al. |
| 6,119,729 A | 9/2000 | Oberholzer et al. |
| 6,126,723 A | 10/2000 | Drost et al. |
| 6,129,145 A | 10/2000 | Yamamoto et al. |

| | | | | | | |
|---|---|---|---|---|---|---|
| 6,129,260 | A | 10/2000 | Andrus et al. | 6,609,560 | B1 | 8/2003 | Cho et al. |
| 6,131,650 | A | 10/2000 | North et al. | 6,632,655 | B1 | 10/2003 | Mehta et al. |
| 6,140,860 | A | 10/2000 | Sandhu et al. | 6,632,719 | B1 | 10/2003 | DeBoer et al. ............. 438/381 |
| 6,146,103 | A | 11/2000 | Lee et al. | 6,651,735 | B1 | 11/2003 | Cho et al. |
| 6,154,363 | A | 11/2000 | Chang | 6,729,383 | B1 | 5/2004 | Cannell et al. |
| 6,159,353 | A | 12/2000 | West et al. | 6,743,664 | B1 | 6/2004 | Liang et al. |
| 6,167,948 | B1 | 1/2001 | Thomas | 2001/0016985 | A1 | 8/2001 | Insley et al. |
| 6,171,067 | B1 | 1/2001 | Parce | 2001/0024820 | A1 | 9/2001 | Mastromatteo et al. |
| 6,174,675 | B1 | 1/2001 | Chow et al. | 2001/0044155 | A1 | 11/2001 | Paul et al. |
| 6,176,962 | B1 | 1/2001 | Soane et al. | 2001/0045270 | A1 | 11/2001 | Bhatti et al. |
| 6,186,660 | B1 | 2/2001 | Kopf-Sill et al. | 2001/0046703 | A1 | 11/2001 | Burns et al. |
| 6,206,022 | B1 | 3/2001 | Tsai et al. | 2001/0055714 | A1 | 12/2001 | Cettour-Rose et al. |
| 6,210,986 | B1 | 4/2001 | Arnold et al. | 2002/0011330 | A1 | 1/2002 | Insley et al. |
| 6,216,343 | B1 | 4/2001 | Leland et al. | 2002/0075645 | A1 | 6/2002 | Kitano et al. |
| 6,221,226 | B1 | 4/2001 | Kopf-Sill | 2002/0121105 | A1 | 9/2002 | McCarthy, Jr. et al. |
| 6,227,809 | B1 | 5/2001 | Forster et al. | 2002/0134543 | A1 | 9/2002 | Estes et al. |
| 6,234,240 | B1 | 5/2001 | Cheon | 2003/0062149 | A1 | 4/2003 | Goodson et al. |
| 6,238,538 | B1 | 5/2001 | Parce et al. | 2003/0121274 | A1 | 7/2003 | Wightman |
| 6,253,832 | B1 | 7/2001 | Hallefalt | 2003/0213580 | A1 | 11/2003 | Philpott et al. |
| 6,253,835 | B1 * | 7/2001 | Chu et al. .................. 165/80.4 | 2004/0040695 | A1 | 3/2004 | Chesser et al. |
| 6,257,320 | B1 | 7/2001 | Wargo | 2004/0052049 | A1 | 3/2004 | Wu et al. |
| 6,277,257 | B1 | 8/2001 | Paul et al. | 2004/0089008 | A1 | 5/2004 | Tilton et al. |
| 6,287,440 | B1 | 9/2001 | Arnold et al. | 2004/0125561 | A1 | 7/2004 | Gwin et al. |
| 6,301,109 | B1 | 10/2001 | Chu et al. | 2004/0160741 | A1 | 8/2004 | Moss et al.. |
| 6,313,992 | B1 | 11/2001 | Hildebrandt | 2004/0188069 | A1 | 9/2004 | Tomioka et al. |
| 6,317,326 | B1 | 11/2001 | Vogel et al. | | | | |
| 6,321,791 | B1 | 11/2001 | Chow | | | | |
| 6,322,753 | B1 | 11/2001 | Lindberg et al. | | | | |
| 6,324,058 | B1 | 11/2001 | Hsiao | | | | |
| 6,330,907 | B1 | 12/2001 | Ogushi et al. | | | | |
| 6,336,497 | B1 | 1/2002 | Lin | | | | |
| 6,337,794 | B1 | 1/2002 | Agonafer et al. | | | | |
| 6,351,384 | B1 | 2/2002 | Daikoku et al. | | | | |
| 6,366,462 | B1 | 4/2002 | Chu et al. | | | | |
| 6,366,467 | B1 | 4/2002 | Patel et al. | | | | |
| 6,367,544 | B1 | 4/2002 | Calaman | | | | |
| 6,388,317 | B1 | 5/2002 | Reese | | | | |
| 6,396,706 | B1 | 5/2002 | Wohlfarth | | | | |
| 6,397,932 | B1 | 6/2002 | Calaman et al. | | | | |
| 6,400,012 | B1 | 6/2002 | Miller et al. | | | | |
| 6,406,605 | B1 | 6/2002 | Moles | | | | |
| 6,415,860 | B1 | 7/2002 | Kelly et al. | | | | |
| 6,416,642 | B1 | 7/2002 | Alajoki et al. | | | | |
| 6,417,060 | B1 | 7/2002 | Tavkhelidze et al. | | | | |
| 6,424,531 | B1 | 7/2002 | Bhatti et al. | | | | |
| 6,431,260 | B1 | 8/2002 | Agonafer et al. | | | | |
| 6,437,981 | B1 * | 8/2002 | Newton et al. ............. 361/700 | | | | |
| 6,438,984 | B1 | 8/2002 | Novotny et al. | | | | |
| 6,443,222 | B1 | 9/2002 | Yun et al. | | | | |
| 6,444,461 | B1 | 9/2002 | Knapp et al. | | | | |
| 6,457,515 | B1 | 10/2002 | Vafai et al. | | | | |
| 6,459,581 | B1 | 10/2002 | Newton et al. | | | | |
| 6,466,442 | B1 | 10/2002 | Lin | | | | |
| 6,477,045 | B1 | 11/2002 | Wang | | | | |
| 6,492,200 | B1 | 12/2002 | Park et al. | | | | |
| 6,495,015 | B1 | 12/2002 | Schoeniger et al. | | | | |
| 6,519,151 | B1 | 2/2003 | Chu et al. | | | | |
| 6,533,029 | B1 | 3/2003 | Phillips | | | | |
| 6,536,516 | B1 | 3/2003 | Davies et al. | | | | |
| 6,537,437 | B1 | 3/2003 | Galambos et al. | | | | |
| 6,543,521 | B1 | 4/2003 | Sato et al. | | | | |
| 6,553,253 | B1 | 4/2003 | Chang | | | | |
| 6,572,749 | B1 | 6/2003 | Paul et al. | | | | |
| 6,578,626 | B1 | 6/2003 | Calaman et al. | | | | |
| 6,581,388 | B1 | 6/2003 | Novotny et al. | | | | |
| 6,587,343 | B1 | 7/2003 | Novotny et al. | | | | |
| 6,588,498 | B1 | 7/2003 | Bhatti et al. | | | | |
| 6,591,625 | B1 | 7/2003 | Simon | | | | |
| 6,600,220 | B1 | 7/2003 | Barber et al. | | | | |
| 6,601,643 | B1 | 8/2003 | Cho et al. | | | | |
| 6,606,251 | B1 | 8/2003 | Kenny, Jr. et al. | | | | |

OTHER PUBLICATIONS

Shuchi Shoji et al., "Microflow devices and systems", J. Microcech. Microeng. 4 (1994), pp. 157–171, printed in the U.K.

Angela Rasmussen et al., "Fabrication Techniques to Realize CMOS–Compatible Microfluidic Microchannels", Journal of Microelectromechanical, Vo. 10, No. 2, Jun. 2001, pp. 286–297.

J. H. Wang et al., "Thermal–Hydraulic Characteristic of Micro Heat Exchangers", 1991, DSC–vol. 32, Micromechanical Sensors, Actuators, and Systems, pp. 331–339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16–23.

X. F. Peng et al., "Heat Transfer Characteristics of Water Flowing through Microchannels", Experimental Heat Transfer An International Journal, vol. 7, No. 4, Oct.–Dec. 1994, pp. 265–283.

Linan Jiang et al., "Forced Convection Boiling in a Microchannel Heat Sink", Journal of Microelectromechanical Systems, vol. 10, No. 1, Mar. 2001, pp. 80–87.

Muhammad M. Rahman et al., "Experimental Measurements of Fluid Flow and Heat Transfer in Microchannel Cooling Passages in a Chip Substrate", 1993, EEP–vol. 4–2, Advances in Electronic Packages, pp. 685–692.

X. F. Peng et al., "Forced convection and flow boiling heat transfer for liquid flowing through Microchannels", 1993, Int. J. Heat Mass Transfer, vol. 36, No. 14, pp. 3421–3427.

Lung–Jieh Yang et al., "A Micro Fluidic System of Micro Channels with On–Site Sensors by Silicon Bulk Micromaching", Sep. 1999, Microfluidic Devices and Systems II, vol. 3877, pp. 267–272.

G. Mohiuddin Mala et al., "Heat transfer and fluid flow in microchannels", 1997, Int. J. Mass transfer, vol. 40, No. 13, pp. 3079–3088, printed in Great Britain.

J. M. Cuta et al., "Fabrication and Testing of Micro–Channel Heat Exchangers", SPIE Microlithography and Metrology in Micromaching, vol. 2640, 1995, pp. 152–160.

Linan Jiang et al., "A Micro–Channel Heat Sink with Integrated Temperature Sensors for Phase Transition Study", 1999, 12$^{th}$ IEEE International Conference on Micro Electro Mechanical Systems, pp. 159–164.

Linan Jiang et al., "Fabrication and characterization of a microsystem for a micro–scale heat transfer study", J. Micromech. Microeng. 9 (1999) pp. 422–428, printed in the U.K.

M. B. Bowers et al., "High flux boiling in low flow rate, low pressure drop mini–channel and micro–channel heat sinks", 1994, Int. J. Heat Mass Transfer, vol. 37, No. 2, pp. 321–332.

Yongendra Joshi, "Heat out of small packages", Dec. 2001, Mechanical Engineer, pp. 56–58.

A. Rostami et al., "Liquid Flow and Heat Transfer in Microchannels: a Review", 2000, Heat and Technology, vol. 18, No. 2, pp. 59–68.

Lian Zhang et al., "Measurements and Modeling of Two–Phase Flow in Microchannels with Nearly Constant Heat Flux Boundary Conditions", Journal of Microelectromechanical Systems, vol. 11, No. 1, Feb. 2002, pp. 12–19.

Muhammad Mustafizur Rahman, "Measurements of Heat Transfer in Microchannel Heat Sinks", Int. Comm. Heat Mass Transfer, vol. 27, No. 4, May 2000, pp. 495–506.

Issam Mudawar et al., "Enhancement of Critical Heat Flux from High Power Microelectronic Heat Sources in a Flow Channel", Journal of Electronic Packaging, Sep. 1990, vol. 112, pp. 241–248.

Nelson Kuan, "Experimental Evaluation of Micro Heat Exchangers Fabricated in Silicon", 1996, HTD–vol. 331, National Heat Transfer Conference, vol. 9, pp. 131–136.

E. W. Kreutz et al., "Simulation of micro–channel heat sinks for optoelectronic microsystems", Microelectronics Journal 31(2000) pp. 787–790.

J. C. Y. Koh et al., "Heat Transfer of Microstructure for Integrated Circuits", 1986, Int. Comm. Heat Mass Transfer, vol. 13, pp. 89–98.

Snezana Konecni et al., "Convection Cooling of Microelectronic Chips", 1992, InterSociety Conference on Thermal Phenomena pp. 138–144.

Michael B. Kleiner et al., "High Performance Forced Air Cooling Scheme Employing Microchannel Heat Exchangers", 1995, IEEE Transactions on Components, Packaging, and Manufacturing Technology–Part A, vol. 18, No. 4, pp. 795–804.

Jerry K. Keskn Ph. D. et al., "An Experimental Study on an Enhanced Microchannel Heat Sink for Microelectronics Applications", EEP–vol. 26–2, Advances in Electronic Packaging, 1999, vol. 2, pp. 1235–1259.

Shung–Wen Kang et al., "The Performance Test and Analysis of Silicon–Based Microchannel Heat Sink", Jul. 1999, Terahertz and Gigahertz Photonics, vol. 3795, pp. 259–270.

Joseph C. Tramontana, "Semiconductor Laser Body Heat Sink", Xerox Disclosure Journal, vol. 10, No. 6, Nov./Dec. 1985, pp. 379–381.

Sarah Arulanandam et al., "Liquid transport in rectangular microchannels by electroosmotic pumping", Colloid and Surfaces A: Physicochemical and Engineering Aspects 161 (2000) , pp. 89–102.

Jeffrey D. Barner et al., "Thermal Ink Jet Print Head Carriage with Integral Liquid Cooling Capabilities", Xerox Disclosure Journal–vol. 21, No. 1, Jan./Feb. 1996, pp. 33–34.

"Autonomous displacement of a solution in a microchannel by another solution", Research Disclosure, Jun. 2001, pp. 1046–1047.

John M. Waldvogel, "Aluminum Silicon Carbide Phase Change Heat Spreader", Motorola, Jun. 1999, Technical Developments, pp. 226–230.

James P. Slupe et al., "An idea for maintaining a stable thermal environment for electronic devices", Research Disclosure, Aug. 2001, p. 1312.

John M. Waldvogel, "A Heat Transfer Enhancement Method for Forced Convection Bonded–Fin Heatsinks", Motorola, Dec. 1997, Technical Developments, pp. 158–159.

"Thin Heat Pipe for Cooling Components on Printed Circuit Boards", IBM Technical Disclosure Bulletin, vol. 34, No. 7B, Dec. 1991, pp. 321–322.

R. C. Chu et al., "Process for Nucleate Boiling Enhancement", IBM Technical Disclosure Bulletin, vol. 18, No. 7, Dec. 1975, pp. 2227.

J. Riseman, "Structure for Cooling by Nucleate Boiling", IBM Technical Disclosure Bulletin, vol. 18, No. 11, Apr. 1976, p. 3700.

"Integrally Grooved Semiconductor Chip and Heat Sink", Oct. 1971, IBM Technical Disclosure Bulletin, vol. 14, No. 5, pp. 1425.

"Enhanced Cooling of Thermal Conduction Module", IBM Technical Disclosure Bulletin, vol. 30, No. 5, Oct. 1987, p. 426.

"Heat Exchanger Modules for Data Process with Valves Operated by Pressure form Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellow Providing Inlet, Outlet and Redundant Connections to Water–Cooled Element", IBM Technical Bulletin, vol. 30, No. 5, Oct. 1987, pp. 345–347.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39–40.

"Chip Cooling Device", IBM Technical Disclosure Bulletin, vol. 30, No. 9, Feb. 1988, pp. 435–436.

W.E. Ahearn et al., "Silicon Heat Sink Method to Control Integrated Circuit Chip Operating Temperatures", IBM Technical Disclosure Bulletin, vol. 21, No. 8, Jan. 1979, pp. 3378–3380.

N. P. Bailey et al., "Cooling Device for Controlled Rectifier", IBM Technical Disclosure Bulletin, vol. 21, No. 11, Apr. 1979, pp. 4609–4610.

W. J. Kleinfelder et al., "Liquid–Filled Bellows Heat Sink", IBM Technical Disclosure Bulletin, vol. 21, No. 10, Mar. 1979, pp. 4125–4126.

R. P. Chrisfield et al., "Distributed Power/Thermal Control", IBM Technical Disclosure Bulletin, vol. 22, No. 3, Aug. 1979, pp. 1131–1132.

A. J. Arnold et al., "Heat Sink Design for Cooling Modules in a Forced Air Environment", IBM Technical Disclosure Bulletin, vol. 22, No. 6, Nov. 1979, pp. 2297–2298.

A. J. Arnold, "Structure for the Removal of Heat from an Integrated Circuit Module", IBM Technical Disclosure Bulletin, vol. 22, No. 6, Nov. 1979, pp. 2294–2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass–Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat–Pipe Vapor Cooling Etched Silicon Structure", IBM Technical Disclosure Bulletin, vol. 25, No. 8, Jan. 1983, pp. 4118–4119.

J. R. Skobern, "Thermoelectrically Cooled Module", IBM Technical Disclose Bulletin, vol. 27, No. 1A, Jun. 1984, p. 30.

M. J. Brady et al., "Etched Silicon Integrated Circuit Heat Sink", IBM Technical Disclosure Bulletin, vol. 27, No. 1B, Jun. 1984, p. 627.

H. D. Edmonds et al., "Heat Exchange Element for Semiconductor Device Cooling", IBM Technical Disclosure Bulletin, vol. 23, No. 3, Aug. 1980, p. 1057.

R. W. Noth, "Heat Transfer from Silicon Chips and Wafers", IBM Technical Disclosure Bulletin, vol. 17, No. 12, May 1975, p. 3544.

"Forced Boiling Cooling System with Jet Enhancement for Critical Heat Flux Extension", IBM Technical Disclosure Bulletin, vol. 39, No. 10, Oct. 1996, p. 143.

"Miniature Heat Exchanger for Corrosive Media", IBM Technical Disclosure Bulletin, vol. 39, No. 01, Jan. 1995, pp. 55–56.

"Self–Contained Active Heat Dissipation Device", IBM Technical Disclosure Bulletin vol. 39, No. 04, Apr. 1996, pp. 115–116.

C. J. Keller et al., "Jet Cooling Cup for Cooling Semiconductor Devices", IBM Technical Disclosure Bulletin, vol. 20, No. 9, Feb. 1978, pp. 3575–3576.

B. J. Ronkese, "Centerless Ceramic Package with Directly Connected Heat Sink", IBM Technical Disclosure Bulletin, vol. 20, No. 9, Feb. 1978, pp. 3577–3578.

K. S. Sachar, "Liquid Jet Cooling of Integrated Circuit Chips", vol. 20, No. 9, Feb. 1978, pp. 3727–3728.

A. H. Johnson, "Device Cooling", IBM Technical Disclosure Bulletin, vol. 20, No. 10, Mar. 1978, pp. 3919–3920.

A. L. Pacuzzo et al., "Integrated Circuit Module Package Cooling Structure", IBM Technical Disclosure Bulletin, vol. 20, No. 10, Mar. 1978, pp. 3898–3899.

R. D. Durand et al., "Flexible Thermal Conductor for Electronic Module", IBM Technical Disclosure Bulletin, vol. 20, No. 11A, Apr. 1978, p. 4343.

D. Balderes et al., "Liquid Cooling of a Multichip Module Package", IBM Technical Disclosure Bulletin, vol. 20, No. 11A, Apr. 1978, pp. 4336–4337.

J. A. Dorler et al., "Temperature Triggerable Fluid Coupling System for cooling Semiconductor Dies", IBM Technical Disclosure Bulletin, vol. 20, No. 11A, Apr. 1978, pp. 4386–4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, vol. 20, No. 11A, Apr. 1978, pp. 4334–4335.

A. J. Arnold, "Electronic Packaging Structure", IBM Technical Disclosure Bulletin, vol. 20, No. 11B, Apr. 1978, pp. 4820–4822.

V. Y. Doo et al., "High Performance Package for Memory", IBM Technical Disclosure Bulletin, vol. 21, No. 2, Jul. 1978, pp. 585–586.

"Multi–Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141–142.

J. Landrock et al., "Cooling System for Semiconductor Chips", IBM Technical Disclosure Bulletin, vol. 23, No. 4, Sep. 1980, p. 1483.

E. P. Damm, Jr., "Convection Cooling Apparatus", IBM Technical Disclosure Bulletin, vol. 20, No. 7, Dec. 1977, pp. 2755–2756.

"Circuit Package with Circulating Boiling Liquid and Local Heat Exchanger to Limit Vapor in Coolant Outlet", IBM Technical Disclosure Bulletin, vol. 31, No. 12 May 1989, p. 34.

"Circuit Module Cooling with Multiple Pistons Contacting a Heat Spreader/Electrical Plate in Contact with Chip", IBM Technical Disclosure Bulletin, vol. 31, No. 12, May 1989, p. 5–7.

"TCM–LIKE Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, pp. 305–306.

"Water–Cooled Circuit Module with Grooves Forming Water Passages Near Heat–Producing Devices", IBM Technical Disclosure Bulletin, vol. 31, No. 12, May 1989, pp. 49–50.

"Cold Plate for Thermal conduction Module with Only Peripheral Mounting bolts, Large Surface Area Fin Inserts and Reduced Water Flow and Thermal Resistances", IBM Technical Disclosure Bulletin, vol. 31, No. 12, May 1989, p. 59.

"Thermal Control Hardware for Accelerated Run–In Testing of Multi–Chip Modules", IBM Technical Disclosure Bulletin, vol. 32, No. 5A, Oct. 1989, p. 129–130.

"Means of Removing More Heat From a TCM (Or Other Liquid–Cooled Logic Package) By Reducing the Coolant Temperature", IBM Technical Disclosure Bulletin, vol. 32 No. 5A, Oct. 1989, pp. 153–154.

E. G. Loeffel et al., "Liquid Cooled Module with Compliant Membrane", IBM Technical Disclosure Bulletin, vol. 20, No. 2, Jul. 1977, pp. 673–674.

V. Y. Doo et al., "Method of Effective Cooling of a High Power Silicon Chip", IBM Technical Disclosure Bulletin, vol. 20, No. 4, Sep. 1977, p. 1436–1437.

V. Y. Doo et al., Semiconductor Chip Cooling Package, IBM Technical Disclosure Bulletin, vol. 20, No. 4, Sep. 1977, pp. 1440–1441.

"Heat Sink Fabrication Method", IBM Technical Disclosure Bulletin, vol. 27, No. 10A, Mar. 1985, p. 5656–5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 09, Sep. 1994, p. 171.

Youngcheol Joo et al., "Fabrication of Monolithic Microchannels for IC Chip Cooling", 1995, IEEE Micro Electro Mechanical Systems, pp. 362–367.

Jaisree Moorthy et al., *Active control of electroosmotic flow in microchannels using light*, Jan. 26, 2001, Sensors and Actuators B 75, pp. 223–229.

Andreas Manz et al., *Electroosmic pumping and electrophoretic separations for miniaturized chemical analysis systems*, Sep. 16, 1994, J.Micromech. Microeng. 4 (1994), pp. 257–265, printed in the U.K.

E. B. Cummings et al., *Irrotationality of uniform electroosmosis*, Sep. 1999, Part of the SPIE Conference on Microfluidic Devices and Systems II, SPIE vol. 3877, pp. 180–189.

Stephen C. Jacobson et al., *Fused Quartz Substrates for Microchip Electrophoresis*, Jul. 1, 1995, Analytical Chemistry, vol. 67, No. 13, pp. 2059–2063.

Haim H. Bau, *Optimization of conduits' shape in micro heat exchangers*, Dec. 10, 1997, International Journal of Heat and Mass Transfer 41 (1998), pp. 2717–2723.

V. K. Dwivedi et al., *Fabrication of very smooth walls and bottoms of silicon microchannels for heat dissipation of semiconductor devices*, Jan. 25, 2000, Microelectronics Journal 31 (2000), pp. 405–410.

M. B. Bowers et al., *Two-Phase Electronic Cooling Using Mini-Channel and Micro-Channel Heat Sinks: Part 2–Flow Rate and Pressure Drop Constraints*, Dec. 1994, Journal of Electronic Packaging 116, pp. 298–305.

Meint J. de Boer et al., *Micromachining of Buried Micro Channels in Silicon*, Mar. 2000, Journal of Microelectromechanical systems, vol. 9, No. 1, pp. 94–103.

S.B. Choi et al., *Fluid Flow and Heat Transfer in Microtubes*, 1991, DSC–vol. 32, Micromechanical sensors, Actuators, and Systems, ASME 1991, pp. 123–134.

S. F. Choquette, M. Faghri et al., *Optimum Design of Microchannel Heat Sinks*, 1996, DSC–vol. 59, Microelectromechanical Systems (MEMS), ASME 1996, pp. 115–126.

David Copeland et al., *Manifold Microchannel Heat Sinks: Theory and Experiment*, 1995, EEP–vol. 10–2, Advances in Electronic Packaging ASME 1995, pp. 829–835.

J. M. Cuta et al., *Forced Convection Heat Transfer in Parallel Channel Array Microchannel Heat Exchanger*, 1996, PID–vol. 27 HTD–vol. 338, Advances in Energy efficiency, Heat/Mass Transfer Enhancement, ASME 1996, pp. 17–23.

K. Fushinobu et al., *Heat Generation and Transport in Sub-Micron Semiconductor Devices*, 1993, HTD–vol. 253, Heat Transfer on the Microscale, ASME 1993, pp. 21–28.

Charlotte Gillot et al., *Integrated Micro Heat Sink for Power Multichip Module*, Sep. 3, 1999, IEEE Transactions on Industry Applications, vol. 36 No. 1. Jan./Feb. 2000, pp. 217–221.

John Gooding, *Microchannel heat exchangers—a review*, SPIE vol. 1997 High Heat Flux Engineering II (1993), pp. 66–82.

Koichiro Kawano et al., *Micro Channel Heat Exhanger for Cooling Electrical Equipment*, HTD–vol. 361–3/PID–vol. 3, Proceeding of the ASME Heat Transfer Division—vol. 3, ASME 1998, pp. 173–188.

Chad Harris et al., *Design and Fabrication of a Cross Flow Micro Heat Exchanger*, Dec. 2000, Journal of Microelectromechanical Systems, vol. 9, No. 4, pp. 502–508.

George M. Harpole et al., *Micro–Channel Heat Exchanger Optimization*, 1991, Seventh IEEE Semi–Therm Symposium, pp. 59–63.

Pei–Xue Jiang et al., *Thermal–hydraulic performance of small scale micro–channel and prous–media heat–exchangers*, 2001, International Journal of Heat and Mass Transfer 44 (2001), pp. 1039–1051.

X.N. Jiang et al., *Laminar Flow Through Microchannels Used for Microscale Cooling Systems*, 1997, IEEE/CPMT Electronic Packaging Technology Conference, pp. 119–122, Singapore.

David Bazeley Tuckerman, *Heat–Transfer Microstructures for Integrated Circuits*, Feb. 1984, pp. ii–xix, pp. 1–141.

M Esashi, *Silicon micromachining for integrated microsystems*, 1996, Vacuum/vol. 47/Nos. 6–8/pp. 469–474.

T.S. Raviguruajan et al., *Effects of Heat Flux on Two–Phase Flow characteristics of Refrigerant Flows in a Micro–Channel Heat Exchanger*, HTD–vol. 329, National Heat Transfer Conference, vol. 7, ASME 1996, pp. 167–178.

T.S. Ravigruruajan et al., *Single–Phase Flow Thermal Performance Characteristics of a Parallel Micro–Channel Heat Exchanger*, 1996, HTD–vol. 329, National Heat Transfer Conference, vol. 7, ASME 1996, pp. 157–166.

T.S. Ravigururajan et al., *Liquid Flow Characteristics in a Diamond–Pattern Micro–Heat–Exchanger*, DSC–vol. 59 Microelectromechanical Systems (TMEMS), ASME 1996, pp. 159–166.

T.S. Raviguruajan, *Impact of Channel Geometry on Two–Phase Flow Heat Transfer Characteristics of Refrigerants in Microchannel Heat Exchangers*, May 1998, Journal of Heat Transfer, vol. 120, pp. 485–491.

J. Pfahler et al., *Liquid Transport in Micron and Submicron Channels*, Mar. 1990, Sensors and Actuators, A21–A23 (1990), pp. 431–434.

Kenneth Pettigrew et al., *Performance of a MEMS based Micro Capillary Pumped Loop for Chip–Level Temperature Control*, 2001, The 14$^{th}$ IEEE International Conference on Micro Electro Mechanical Systems, pp. 427–430.

C. Perret et al., *Microchannel integrated heat sinks in silicon technology*, Oct. 12–15, 1998, The 1998 IEEE Industry Applications Conference, pp. 1051–1055.

X.F. Peng et al., *Convective heat transfer and flow friction for water flow in microchannel structures*, 1997, Int. J. Heat Mass Transfer, vol. 39, No. 12, pp. 2599–2608, printed in Great Britain.

X.F. Peng et al., *Experimental investigation of heat transfer in flat plates with rectangular microchannels*, 1994, Int. J. Heat Mass Transfer, vol. 38, No. 1, pp. 127–137, printed in Great Britain.

X.F. Peng et al., *Cooling Characteristics with Microchanneled Structures*, 1994, Enhanced Heat Transfer, vol. 1, No. 4, pp. 315–326, printed in the United States of America.

Yoichi Murakami et al., *Parametric Optimization of Multichananneled Heat Sinks for VLSI Chip Cooling*, Mar. 2002, IEEE Transaction on Components and Packaging Technologies, vol. 24, No. 1, pp. 2–9.

D. Mundinger et al., *High average power 2–D laser diode arrays or silicon microchannel coolers*, CLEO '89/Friday Morning/404.

L.J. Missaggia et al., *Microchannel Heat Sinks for Two–Dimensional High–Power–Density Diode Laser Arrays*, 1989, IEEE Journal of Quantum Electronics, vol. 25, No. 9, Sep. 1989, pp. 1989–1992.

M.J. Marongiu et al., *Enhancement of Multichip Modules (MCMs) Cooling by Incorporating MicroHeatPipes and Other High Thermal Conductivity Materials into Microchannel Heat Sinks*, 1998, Electronic Components and Technology Conference, pp. 45–50.

C.R. Friedrich et al, *Micro heat exchangers fabricated by diamond machining*, Jan. 1994, Precision Engineering, vol. 16, No. 1, pp. 56–59.

Mali Mahalingarn, *Thermal Management in Semiconductor Device Packaging*, 1985, Proceedings of the IEEE, vol. 73, No. 9, Sep. 1985, pp. 1396–1404.

T.M. Adams et al., *An experimental investigation of single-–phase forced convection in microchannels*, 1997, Int. J. Heat Mass Transfer, vol. 41, Nos. 6–7, pp. 851–857, Printed in Great Britain.

T.M. Adams et al., *Applicability of traditional turbulent single–phase forced convection correlations to non–circular micrhchannels*, 1999, Int. J. Heat and Transfer 42 (1999) pp. 4411–4413.

Bassam Badran et al., *Experimental Results for Low–Temperature Silicon Micromachined Micro Heat Pipe Arrays Using Water and Methanol as Working Fluids*, May 31, 1997, Experimental Heat Transfer, 10: pp. 253–272.

D. Jed Harrison et al., *Electroosmotic Pumping Within A Chemical Sensor System Integrated on Silicon*, Session C9 Chemical Sensors and Systems for Liquids, Jun. 26, 1991, pp. 792–795.

Kurt Seller et al., *Electroosmotic Pumping and Valveless Control of Fluid Flow within a Manifold of Capillaries on a Glass Chip*, 1994, Analytical Chemistry, vol. 66, No. 20, Oct. 15, 1994, pp. 3485–3491.

Philip H. Paul et al., *Electrokinetic Generation of High Pressures Using Porous Microstructures*, 1998, Micro–Total Analysis Systems, pp. 49–52.

Gh. Mohiuddin Mala et al., *Flow characteristics of water through a microchannel between tow parrallel plates with electrokinetic effects*, 1997, Int. J. Heat and Fluid Flow, vol. 18, No. 5, pp. 489–496.

W.E. Morf et al., *Partial electroosmotic pumping in complex capillary systems Part 1: Principles and general theoretical approach*, Oct. 16, 2000, Sensors and Actuators B 72 (2001), pp. 266–272.

M. Esashi, *Silicon micromachining and micromachines*, Sep. 1, 1993, Wear, vol. 168, No. 1–2, (1993), pp. 181–187.

Stephanus Buttgenbach et al., *Microflow devices for miniaturized chemical analysis systems*, Nov. 4–5, 1998, SPIE–Chemical Microsensors and Applications, vol. 3539, pp. 51–61.

Sarah Arunlanandam et al., *Liquid transport in rectangular microchannels by electroosmotic pumping*, 2000, Colloids and Surfaces A: Physicochemical and Engineering Aspects vol. 161 (2000), pp. 89–102.

Linan Jiang et al., *Closed–Loop Electroosmotic Microchannel Cooling System for VLSI Circuits*, Mechanical Engineering Dept. Stanford University, pp. 1–27.

Susan L. R. Barker et al., *Fabrication, Derivatives and Applications of Plastic Microfluidic Devices*, Proceedings of SPIE, vol. 4205. Nov. 5–8, 2000, pp. 112–118.

Timothy E. McKnight et al., *Electroosmotically Induced Hydraulic Pumping with Integrated Electrodes on Microfluidic Devices*, 2001, Anal. Chem., vol. 73, pp. 4045–4049.

Chris Bourne, *Cool Chips plc Receives Nanotech Manufacturing Patent*, Jul. 31, 2002, pp. 1–2.

Frank Wagner et al., *Electroosmotic Flow Control in Micro Channels Produced by Scanning Excimer Laser Ablation*, 2000, Proceedings of SPIE vol. 4088, Jun. 14–16, 2000, pp. 337–340.

H. A. Goodman, *Data Processor Cooling With Connection To Maintain Flow Through Standby Pump*, Dec. 1983, IBM Technical Disclosure Bulletin, vol. 26, No. 7A, p. 3325.

*Electroerosion Micropump*, May 1990, IBM Technical Disclosure Bulletin, vol. 32, No. 12, pop. 342–343.

Shulin Zeng et al., *Fabrication and Characterization of Electrokinetic Micro Pumps*, 2000 Inter Society Conference on Thermal Phenomena, pp. 31–35.

A. Manz et al., *Integrated Electroosmotic Pumps and Flow Manifolds for Total Chemical Analysis System*, 1991, Inter. Conf. on Solid–State Sensors and Actuators, pp. 939–941.

O. T. Guenat et al., *Partial electroosmotic pumping in complex capillary systems Part: 2 Fabrication and application of a micro total analysis system suited for continuous volumetric nanotitrations*, Oct. 16, 2000, Sensors and Atuators B 72 (2001) pp. 273–282.

J. G. Sunderland, *Electrokinetic dewatering and thickening. I. Introduction and historical review of electrokinetic applications*, Sep. 1987, Journal of Applied Electrochemistry vol. 17, No. 5, pp. 889–898.

J. C. Rife et al., *Acousto– and electroosmotic microfluidic controllers*, 1998, Microfluidic Devices and Systems, vol. 3515, pp. 125–135.

Purnendu K. Dasgupta et al., *Electroosmosis: A Reliable Fluid Propulsion System for Flow Injection Analysis*, 1994, Anal. Chem., vol. 66, No. 11, pp. 1972–1798.

Ray Beach et al., *Modular Microchannel Cooled Heatsinks for High Average Power Laser Diode Arrays*, Apr. 1992, IEEE Journal of Quantum Electronics, vol. 28, No. 4, pp. 966–976.

Roy W. Knight et al., *Optimal Thermal Design of Air cooled Forced Convection finned Heat Sinks—Experimental Verification*, Oct. 1992, IEEE Transactions on Components, Hybrids, and Manufacturing Technology, vol. 15, No. 5 pp. 754–760.

Y. Zhuang et al., *Experimental study on local heat transfer with liquid impingement flow in two–dimensional micro-–channels*, 1997, Int. J. Heat Mass Transfer, vol. 40, No. 17, pp. 4055–4059.

D. Yu et al., *An Experimental and Theoretical Investigation of Fluid Flow and Heat Transfer in Microtube*, 1995, ASME / JSME Thermal Engineering Conference, vol. 1, pp. 523–530.

Xiaoqing Yin et al., *Micro Heat Exchangers Consisting of Pin Arrays*, 1997, Journal of Electronic Packaging Mar. 1997, vol. 119, pp. 51–57.

X. Yin et al., *Uniform Channel Micro Heat Exchangers*, 1997, Journal of Electronic Packaging Jun. 1997, vol. 119, No. 2, pp. 89–94.

Chun Yang et al., *Modeling forced liquid convection in rectangular microchannels with electrokinetic effect*, 1998, International Journal of Heat and Mass Transfer 41 (1998), pp. 4229–4249.

Arel Weisberg et al., *Analysis of microchannels for integrated cooling*, 1992, Int. J. Heat Mass Transfer, vol. 35, No. 10, pp. 2465–2473.

Roger S. Stanley et al., *Two–Phase Flow in Microchannels*, 1997, DSE–vol. 62/HTD–vol. 354, MEMS, pp. 143–152.

B. X. Wang et al., *Experimental investigation on liquid forced–convection heat transfer through microchannels*, 1994, Int. J. Heat Mass Transfer, vol. 37 Suppl. 1, pp. 73–82.

Kambiz Vafai et al., *Analysis of two–layered micro–channel heat sink concept in electronic cooling*, 1999, Int. J. Heat Mass Transfer, 42 (1999), pp. 2287–2297.

Gokturk Tune et al., *Heat transfer in rectangular microchannels*, 2002, Int. J. Heat Mass Transfer, 45 (2000), pp. 765–773.

D. B. Tuckerman et al., *High–Performance Heat Sinking for VLSI*, 1981, IEEE Electron Device Letters, vol. EDL–2, No. 5, pp. 126–129.

Bengt Sunden et al., *An Overview of Fabrication Methods and Fluid Flow and Heat Transfer Characteristics of Micro Channels*, pp. 3–23.

David S. Shen et al., *Micro Heat Spreader Enhance Heat Transfer in MCMs*, 1995, IEEE Multi–Chip Module Conference, pp. 189–194.

S. Sasaki et al., *Optimal Structure for Microgrooved Cooling Fin for High–Power LSI Devices*, Electronic Letters, Dec. 4, 1986, vol. 22, No. 25.

Vijay K. Samalam, *Convective Heat Transfer in Microchannels*, Sep. 1989, Journal of Electronic Materials, vol. 18, No. 5, pp. 611–617.

Sanjay K. Roy et al., *A Very High Heat Flux Microchannel Heat Exchanger for Cooling of Semiconductor Laser Diode Arrays*, 1996, IEEE Transactions on components, packaging, and manufacturing technology–part B, vol. 19, No. 2, pp. 444–451.

Charlotte Gillot et al., *Integrated Single and Two–Phase Micro Heat Sinks Under IGBT Chips*, IEEE Transactions on Components and Packaging Technology, vol. 22, No. 3, Sep. 1999, pp. 384–389.

X.F. Peng et al., "Enhancing the Critical Heat Flux Using Microchanneled Surfaces", Enhanced Heat Transfer, 1998, vol. 5 pp. 165–176.

H. Krumm "Chip Cooling", IBM Technical Disclosure Bulletin, vol. 20, No. 7, Dec. 1977, p. 2728.

Jae–Mo Koo et al., "Modeling of Two–Phase Microchannel Heat Sinks for VLSI Chips", Mech. Eng. Depart. of Stanford University, pp. 422–426.

\* cited by examiner

METHOD AND APPARATUS FOR ACHIEVING TEMPERATURE UNIFORMITY AND HOT SPOT COOLING IN A HEAT PRODUCING DEVICE

RELATED APPLICATIONS

This patent application claims priority under 35 U.S.C. 119(e) of the co-pending U.S. Provisional Patent Application, Ser. No. 60/462,245, filed Apr. 11, 2003 and entitled "RING STIFFENER PROTECTOR AND REMOVEABLE SPREADER LID", which is hereby incorporated by reference. This patent application also claims priority under 35 U.S.C. 119(e) of the co-pending U.S. Provisional Patent Application, Ser. No. 60/423,009, filed Nov. 1, 2002 and entitled "METHODS FOR FLEXIBLE FLUID DELIVERY AND HOTSPOT COOLING BY MICROCHANNEL HEAT SINKS", which is hereby incorporated by reference. In addition, this patent application claims priority under 35 U.S.C. 119(e) of co-pending U.S. Provisional Patent Application, Ser. No. 60/442,383, filed Jan. 24, 2003 and entitled "OPTIMIZED PLATE FIN HEAT EXCHANGER FOR CPU COOLING", which is hereby incorporated by reference. Additionally, this application claims priority under 35 U.S.C. 119(e) of co-pending U.S. Provisional Patent Application, Ser. No. 60/455,729, filed Mar. 17, 2003 and entitled MICROCHANNEL HEAT EXCHANGER APPARATUS WITH POROUS CONFIGURATION AND METHOD OF MANUFACTURING THEREOF", which is hereby incorporated by reference.

FIELD OF THE INVENTION

The invention relates to a method of and apparatus for cooling a heat producing device in general, and specifically, to a method of and apparatus for reducing temperature differences and achieving hot spot cooling in a heat source.

BACKGROUND OF THE INVENTION

Since their introduction in the early 1980's, microchannel heat sinks have shown much potential for high heat-flux cooling applications and have been used in the industry. However, existing microchannels include conventional parallel channel arrangements which are not optimally suited for cooling heat producing devices which have spatially-varying heat loads. Such heat producing devices have areas which produce more heat per unit area than others. These hotter areas are hereby designated as "hot spots" whereas the areas of the heat source which do not produce as much heat are hereby termed, "warm spots". In the simplest case, a hot spot is an area of a heat source, for example a microprocessor, which has a substantially higher heat flux than the other areas of the heat source. In addition, a substantially varying heat flux across the surface of the heat source can induce temperature differences along the heat source surface, thereby forming multiple hot spots.

FIG. 1A illustrates a perspective view of a heat source 99 having multiple hot spots therein. As shown in FIG. 1A, although the hot spots have a higher heat flux than other areas in the heat source, a peripheral area proximal to the hot spot also has a higher temperature relative to the non-hot spot areas, due to the propagation of heat through the heat source material. Therefore, the area shown within the dashed lines in FIG. 1A that is peripheral to the hot spots are higher in temperature than the areas outside of the dashed lines. Therefore, the hot spot area as well as the immediate surrounding area is defined as the hot spot and is called an interface hot spot region.

Alternatively, the heat source 99 does not have any hot spots, as shown in FIG. 1B. FIG. 1B illustrates a perspective view of a heat source 99 having no hot spots therein along with an aligned graph which represents the temperature variation as a function of distance in the X and Y directions. Although the heat source 99 in FIG. 1B does not have any hot spots, the physics of heat propagation in materials dictates that the middle of the heat source 99 will have a higher heat flux than the surrounding areas and edges of the heat source 99. This is shown in the graph in FIG. 1B. Prior art heat exchangers only focus on cooling the heat source and thereby do not focus on the aspects of hot spot cooling or overall temperature uniformity.

What is needed is a fluidic cooling loop system with a heat exchanger utilizing various design controls and cooling methods to achieve temperature uniformity in the heat source. What is also needed is a fluidic cooling loop system with a heat exchanger utilizing various design and control methods to effectively cool hot spots in a heat source.

SUMMARY OF THE INVENTION

One aspect of the invention is directed to a method of controlling temperature of a heat source in contact with a heat exchanging surface of a heat exchanger, wherein the heat exchanging surface is substantially aligned along a plane. The method comprises channeling a first temperature fluid to the heat exchanging surface, wherein the first temperature fluid undergoes thermal exchange with the heat source along the heat exchanging surface. The method comprises channeling a second temperature fluid from the heat exchange surface, wherein fluid is channeled to minimize temperature differences along the heat source.

Another aspect of the invention is directed to a heat exchanger for controlling a heat source temperature. The heat exchanger comprises a first layer that is in substantial contact with the heat source. The first layer is configured to perform thermal exchange with fluid flowing in the first layer, wherein the first layer is aligned along a first plane. The heat exchanger comprises a second layer that is coupled to the first layer and channels fluid to and from the first layer. The heat exchanger is configured to minimize temperature differences along the heat source.

Another aspect of the invention is directed to a hermetic closed loop system which controls a temperature of a heat source. The system comprises at least one heat exchanger for controlling the temperature of the heat source. The heat exchanger further comprises an interface layer that is in substantial contact with the heat source and is configured to channel fluid along at least one thermal exchange path, whereby the interface layer is configured along a first plane. The heat exchanger also further comprises a manifold layer which delivers inlet fluid along at least one inlet path and removes outlet fluid along at least one outlet path. The heat exchanger is configured to achieve substantial temperature uniformity in the heat source. The system also comprises at least one pump for circulating fluid throughout the loop. The at least one pump is coupled to the at least one heat exchanger. The system also comprises at least one heat rejector which is coupled to the at least one pump and the at least one heat exchanger.

In one embodiment, the second layer further comprises a plurality inlet fluid paths which are configured substantially perpendicular to the first plane. The second layer also includes a plurality of outlet paths which are configured substantially perpendicular to the first plane, wherein the inlet and outlet paths are arranged parallel with one another.

In another embodiment, the second layer further comprises a plurality inlet fluid paths which are configured substantially perpendicular to the first plane. The second layer also includes a plurality of outlet paths which are configured substantially perpendicular to the first plane, wherein the inlet and outlet paths are arranged in non-parallel relation with one another. In yet another embodiment, the second layer further comprises a first level which has at least one first port that is configured to channel fluid to the first level and a second level having at least one second port. The second level is configured to channel fluid from the first level to the second port, wherein fluid in the first level flows separately from the fluid in the second level.

In the above embodiments, the fluid is in single phase, two phase, or a transition between single and two phase flow. The fluid is channeled along at least one fluid path which is configured to apply a desired fluidic resistance to the fluid The fluid paths include a length dimension and a hydraulic dimension wherein the hydraulic dimension varies with respect to the flow length dimension. The hydraulic dimension is adjustable in response to one or more operating conditions in the heat exchanger. The present invention includes a means for sensing at least one desired characteristic at a predetermined location along the fluid path. The fluid is directed to a first circulation path along a first desired region of the heat exchanging surface. The fluid is also directed to a second circulation path along a second desired region of the heat exchanging surface, wherein the first circulation path flows independently of the second circulation path. One or more selected areas in the heat exchange surface are configured to have a desired thermal conductivity to control the thermal resistance. The heat exchange surface is configured to include a plurality of heat transferring features thereupon, wherein heat is transferred between the fluid and the plurality of heat transferring features. A portion of the heat exchange surface is roughened to a desired roughness to control at least one of the fluidic and thermal resistances. At least one of the heat transferring features further comprises a pillar, a microchannel and/or a microporous structure. The heat exchange surface includes a desired number of heat transferring features disposed per unit area to control the fluidic resistance to the fluid. In one embodiment, the fluidic resistance is optimized by selecting an appropriate pore size and an appropriate pore volume fraction in a microporous structure. In another embodiment, the fluidic resistance is optimized by selecting an appropriate number of pillars and an appropriate pillar volume fraction in the unit area. In another embodiment, the fluidic resistance is optimized by selecting an appropriate hydraulic diameter for at least one microchannel. The heat transferring feature has a length dimension which is optimized to control the fluidic resistance to the fluid. At least one dimension of at least a portion of the heat transferring feature is optimized to control the fluidic resistance to the fluid. Alternatively, a distance between two or more heat transferring features is optimized to control the fluidic resistance to the fluid. Alternatively, a coating is applied upon at least a portion of at least one heat transferring feature in the plurality to control at least one of the thermal and fluidic resistances. A surface area of at least one heat transferring feature is optimized to control the thermal and fluidic resistances to the fluid. At least one flow impeding element is configured along the fluid path, wherein the at least one flow impeding element controls a resistance. Additionally, a pressure of the fluid is adjusted at a predetermined location along the fluid path to control an instantaneous temperature of the fluid. A flow rate of the fluid is also adjusted at a predetermined location along the flow path to control an instantaneous temperature of the fluid.

Other features and advantages of the present invention will become apparent after reviewing the detailed description of the preferred and alternative embodiments set forth below.

DETAILED DESCRIPTION OF THE PRESENT INVENTION

Generally, a closed-loop fluid system according to the present invention operating in conjunction with a heat exchanger to capture thermal energy generated from a heat source by passing fluid through selective areas of the interface layer in contact with the heat source. In particular, the fluid can be directed in one or two phase flow to specific areas in the interface layer to cool hot spots and/or to reduce temperature differences across the heat source while maintaining an optimal pressure drop within the heat exchanger. In addition, achieving temperature uniformity encompasses minimizing temperature gradients that occur automatically in any heat source. In addition, achieving temperature uniformity in the heat source encompasses minimizing temperature gradients in the absence of hot spots, as in FIG. 1B. Therefore, achieving temperature uniformity includes reducing temperatures differences between the hotter areas, warmer areas and cooler areas in the heat source. As discussed below, the heat exchanger as well as the closed loop system of the present invention employ different design concepts and control methods to achieve temperature uniformity throughout the heat source.

It will be apparent to one skilled in the art that although the microchannel heat exchanger of the present invention is described and discussed in relation to cooling hot spot locations in a device, the heat exchanger is alternatively used for heating a cold spot location in a device to achieve temperature uniformity in the heat source. It should also be noted that although the present invention is preferably described as a microchannel heat exchanger, the present invention can be used in other applications and is not limited to the discussion herein.

Figure 2A:
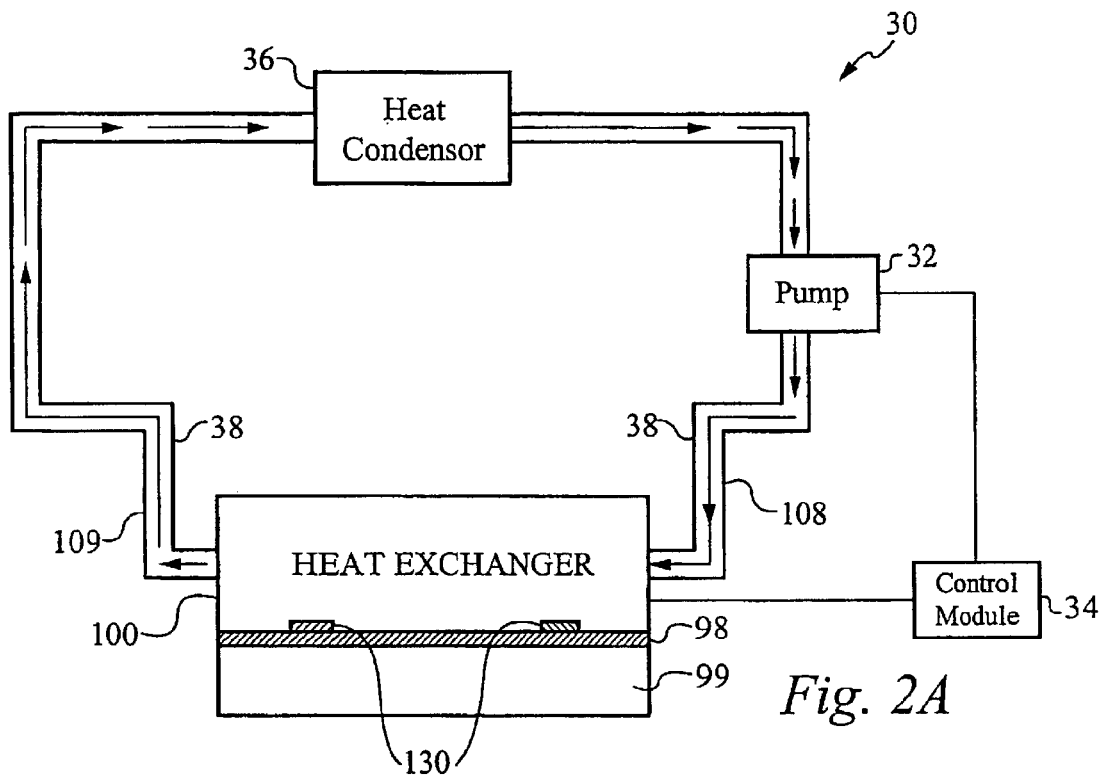
FIG. 2A illustrates a schematic diagram of a closed loop cooling system incorporating a microchannel heat exchanger of the present invention.
Figure 2B:
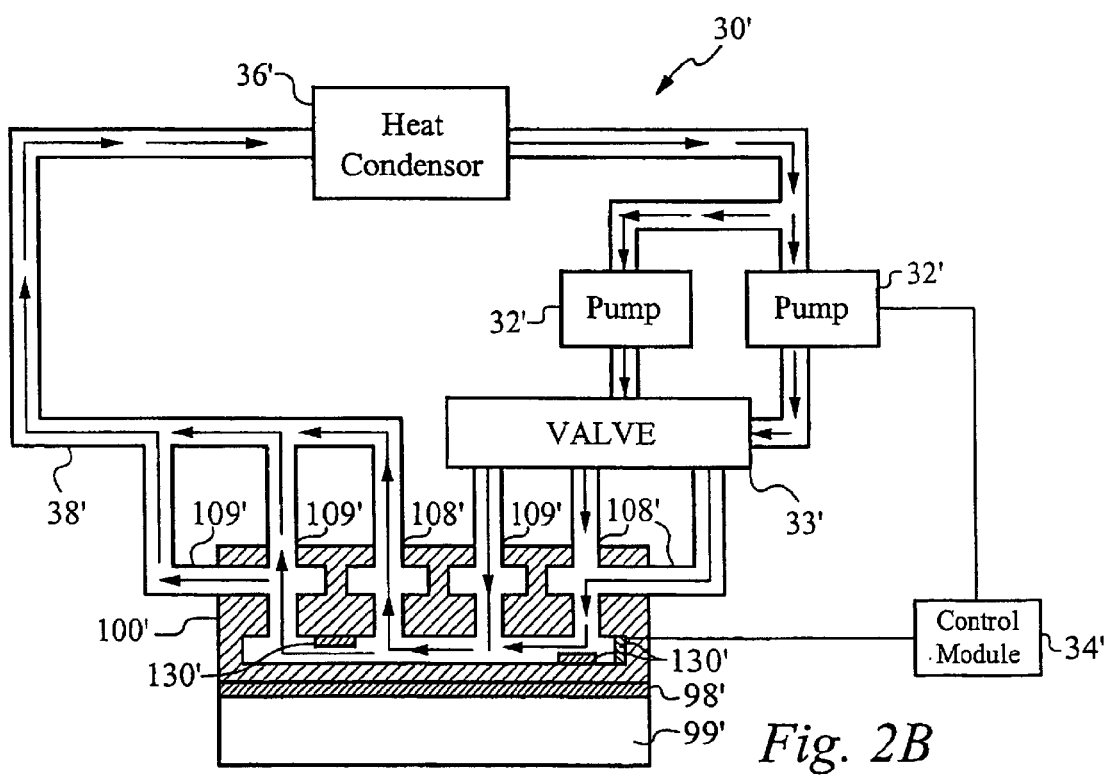
FIG. 2B illustrates a schematic diagram of a closed loop cooling system incorporating a microchannel heat exchanger with multiple pumps of the present invention.

FIG. 2A illustrates a schematic diagram of a hermetically sealed closed loop cooling system 30 which includes the microchannel heat exchanger 100 of the present invention. In addition, FIG. 2B illustrates a schematic diagram of an alternative hermetically sealed closed loop cooling system 30' which includes the microchannel heat exchanger 100' with multiple ports 108', 109' coupled to multiple pumps 32' and a diverting valve 33'. The diverting valve 33' and multiple pumps 32' supply more than one fluid stream to the heat exchanger 100'. It should be noted that the system 30, 30' alternatively incorporates additional components not shown in the figures and is not limited to the configuration shown.

As shown in FIG. 2A, the fluid ports 108, 109 are coupled to fluid lines 38 which are coupled to a pump 32 and a heat condensor 30. The pump 32 pumps and circulates fluid within the closed loop 30. In one embodiment, a uniform, constant amount of fluid flow enters and exits the heat exchanger 100 via the respective fluid ports 108, 109. Alternatively, variable amounts of fluid flow enter and exit through the inlet and outlet port(s) 108', 109 of the heat exchanger 100 at a given time. Alternatively, as shown in FIG. 2B, two or more pumps 32' provide fluid to several designated inlet ports 108' via one or more valves 33'. It will be apparent that the architectures shown in FIGS. 2A and 2B are representative only. Any number of pumps and fluid ports can be provided.

As shown in FIGS. 2A–2B, one or more sensors 130, 130' are coupled to the heat exchanger 100, 100' and/or heat source 99, 99' whereby the sensors 130, 130' provide information of the operating conditions in the heat exchanger 100, 100 to a dynamic sensing and control module 34, 34' The control module 34, 34' is coupled to the pumps 32, 32' and/or heat exchanger 100, 100' and dynamically controls the amount and flow rate of fluid entering and exiting the beat exchanger 100, 100' in response to information received from the one or more sensors 130, 130' regarding changes in heat, hot spot locations, flow rates, fluid temperatures, pressure of the fluid and general operation of the system 30, 30'. For instance, the control module 34' initiates operation of both pumps 32' in response to an increase in the amount of heat in a hot spot location. It should be noted that the sensing and control module 34, 34' is applicable to both cooling systems, as shown in FIGS. 2A–2B.

To better understand the design concepts and methods of the present invention, several heat exchangers are alternatively utilized in the closed loop fluid system 30, 30' and are configureable to incorporate all aspects of the present invention discussed below. The specifics and details of each heat exchanger described below are provided in co-pending patent application Ser. No. Cool-01301, filed on Oct. 6, 2003, and entitled "METHOD AND APPARATUS FOR EFFICIENT VERTICAL FLUID DELIVERY FOR COOLING A HEAT PRODUCING DEVICE", which is hereby incorporated by reference. It is apparent to one skilled in the art that the present invention is not limited only to the heat exchangers described in Serial No. Cool-01301 and is applicable to any other appropriate heat exchangers or heat sinks used.

The interface layer 102 (FIGS. 3A and 4A) is preferably in contact with the heat source and provides heat exchange capabilities to adequately cool the heat source 99. Alternatively, the interface layer 102 is integrally formed within the heat source as one entire component. Alternatively, the interface layer 102 is incorporated into a heat spreader (not shown), whereby the heat spreader is either coupled to or integrally formed within the heat source. The interface layer 102 of the heat exchanger 100 is configured to allow fluid to flow thereupon. The interface layer 102 allows heat transfer from the heat source 99 to the fluid by conduction as well as convection. The interface layer includes any number of similar or different heat transferring features, some of which are described below. It should be apparent to one skilled in the art that the heat transferring features are not limited to the shapes discussed below and alternatively incorporate other appropriate shapes and designs.

Figure 3A:
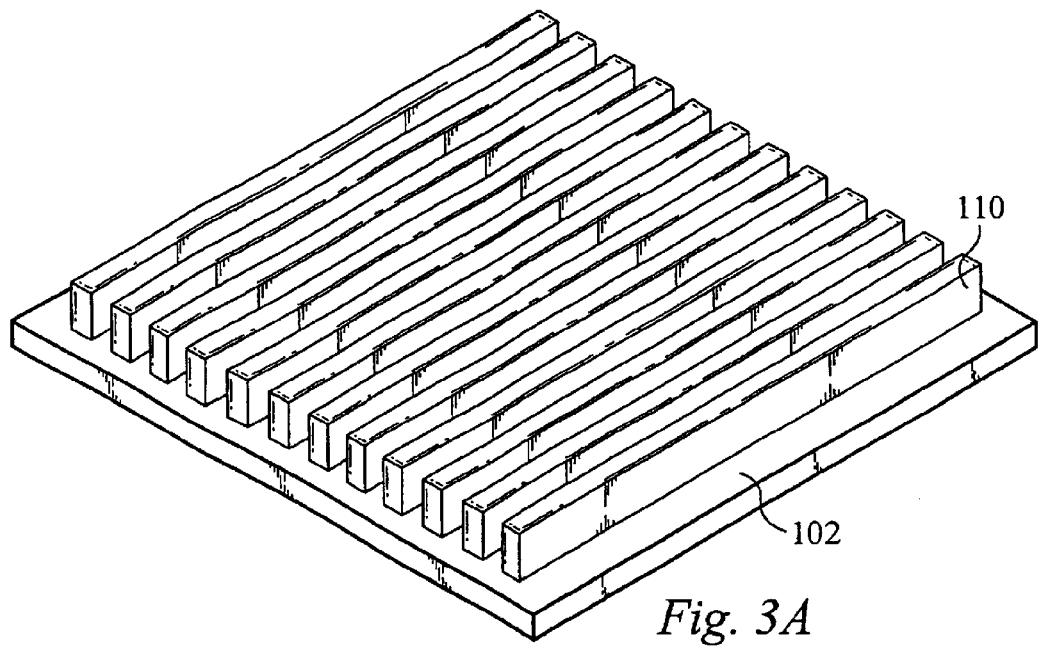
FIG. 3A illustrates a perspective view of the interface layer having several microchannels disposed thereon.

FIG. 3A illustrates a perspective view of the of the interface layer 102 having several microchannels 110 disposed thereon in accordance with the present invention. The microchannels 110 allow the fluid to undergo thermal exchange along the entire interface layer 102 and/or selected hot spot locations of the interface hot spot region to cool the heat source 99. The microchannel walls 110 extend vertically from the bottom surface of the interface layer and are preferably configured to be parallel, as shown in FIG. 3A. Alternatively, the microchannel walls 110 are configured to be non-parallel.

Figure 3B:
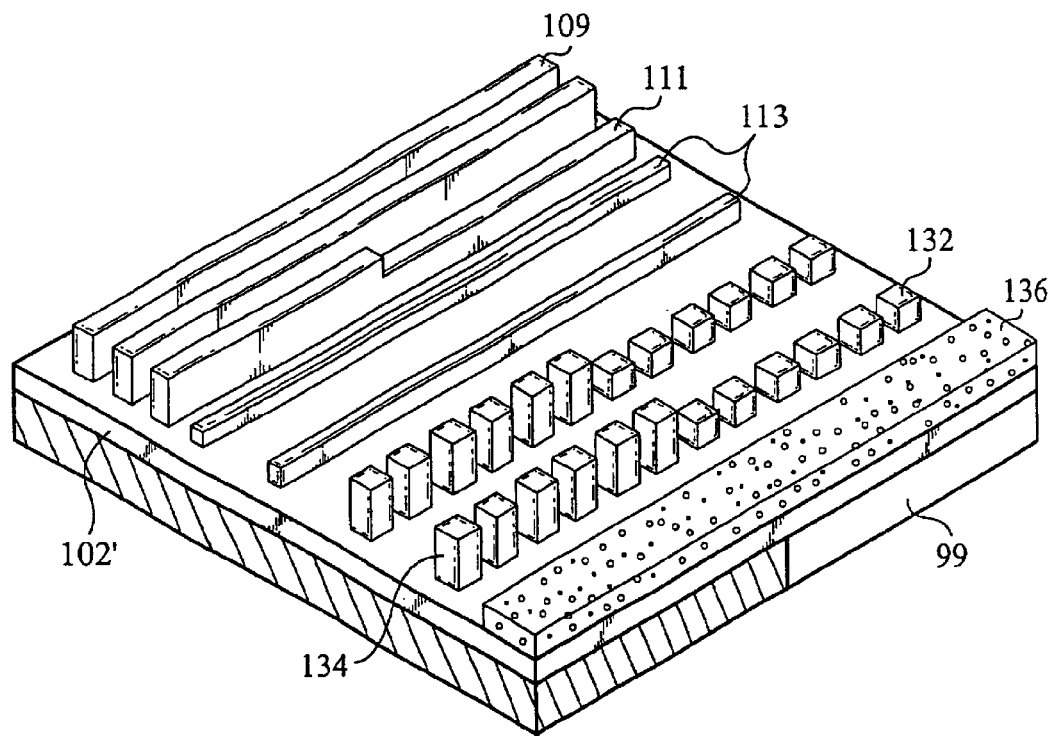
FIG. 3B illustrates a perspective view of the interface layer having several different heat transferring features disposed thereon with differing dimensions.

FIG. 3B illustrates a perspective view of the of the interface layer 102' having several different heat transferring features disposed along the interface layer in accordance with the present invention. The interface layer 102' includes multiple microchannels 109, wherein two of the microchannels are of the same shape and one microchannel 111 has a portion extending taller than the other portion. In addition, the interface layer 102' includes several pillars 132, 134 of various height dimensions disposed thereon in accordance with the present invention. As shown in FIG. 3B, the pillars 134 extend vertically from the bottom surface of the interface layer 102 to a predetermined height, potentially the entire height of the interface layer 102'. The pillars 132 extend vertically an amount less than the pillars 134. The pillars 134 can have any shape including, but not limited to, squared (FIG. 3B), diamond (not shown), elliptical (not shown), hexagonal (not shown), circular or any other shape. The interface layer alternatively has a combination of differently shaped pillars disposed thereupon. In addition, FIG. 38 illustrates a microporous structure 136 disposed on the bottom surface of the interface layer 102'.

It is preferred that the heat exchanger 100 of the present invention is larger in width than the heat source 99. In the case where the heat exchanger 100 is larger than the heat source 99, an overhang dimension exists. The overhang dimension is the farthest distance between one outer wall of the heat source 99 and the interior fluid channel wall of the heat exchanger 100. In the preferred embodiment, the overhang dimension is within the range of and including 0 to 5 millimeters for single phase and 0 to 15 millimeters for two phase fluid. In addition, the interface layer 102 of the present invention preferably has a thickness dimension within the range of and including 0.3 to 0.7 millimeters for single phase fluid and 0.3 to 1.0 millimeters for two phase fluid.

In the embodiment of the heat exchanger 100 which utilizes a microporous structure 136 disposed upon the interface layer 102, the microporous structure 136 has an average pore size within the range of and including 10 to 200 microns for single phase as well as two phase fluid. In addition, the microporous structure 136 has a porosity within the range and including 50 to 80 percent for single phase as well as two phase fluid. The height of the microporous structure 136 is within the range of and including 0.25 to 2.00 millimeters for single phase as well as two phase fluid.

In the embodiment which utilizes pillars 132, 134 (hereinafter referred to as 132) and/or microchannels 109, 111, 113 (hereinafter referred to as 109) along the interface layer 102, the interface layer 102 of the present invention has a thickness dimension in the range of and including 0.3 to 0.7 millimeters for single phase fluid and 0.3 to 1.0 millimeters for two phase fluid. In addition, the area of at least one pillar 132 is in the range of and including (10 micron)$^2$ and (100 micron)$^2$ for single phase as well as two phase fluid. In addition, the area of the separation distance between at least two of the pillars 132 and/or microchannels 109 is in the range of and including 10 to 150 microns for single phase as well as two phase fluid. The width dimension of the microchannels 109 in the range of and including 10 to 100 microns for single phase as well as two phase fluid. The height dimension of the microchannels 109 and/or pillars 132 is within the range of and including 50 to 800 microns for single phase fluid and 50 microns to 2 millimeters for two phase fluid. It is contemplated by one skilled in the art that other dimension are alternatively contemplated.

Figure 3C:
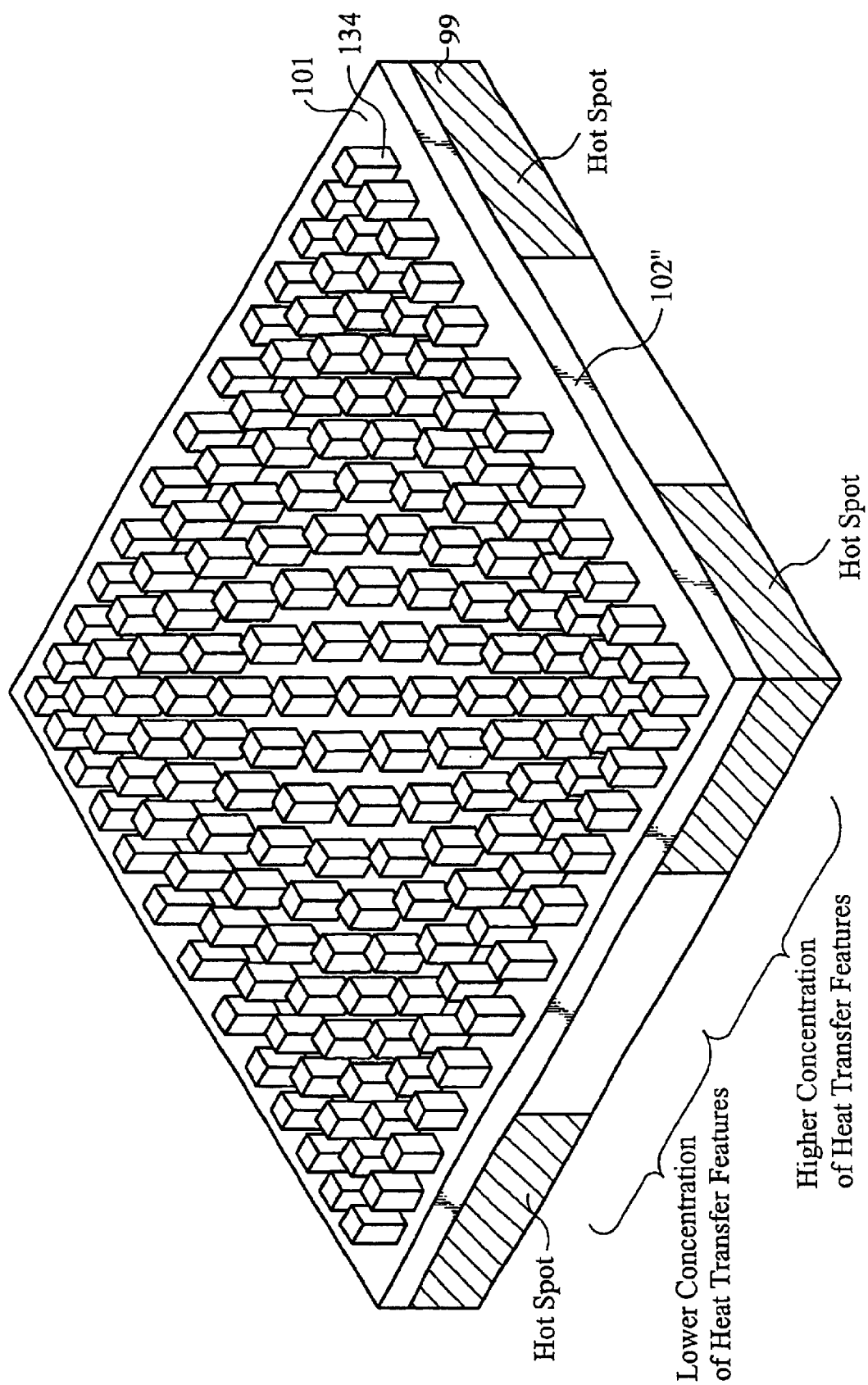
FIG. 3C illustrates a perspective view of the interface layer having a varying density of several micro-pillars disposed thereon.
Figure 3D:
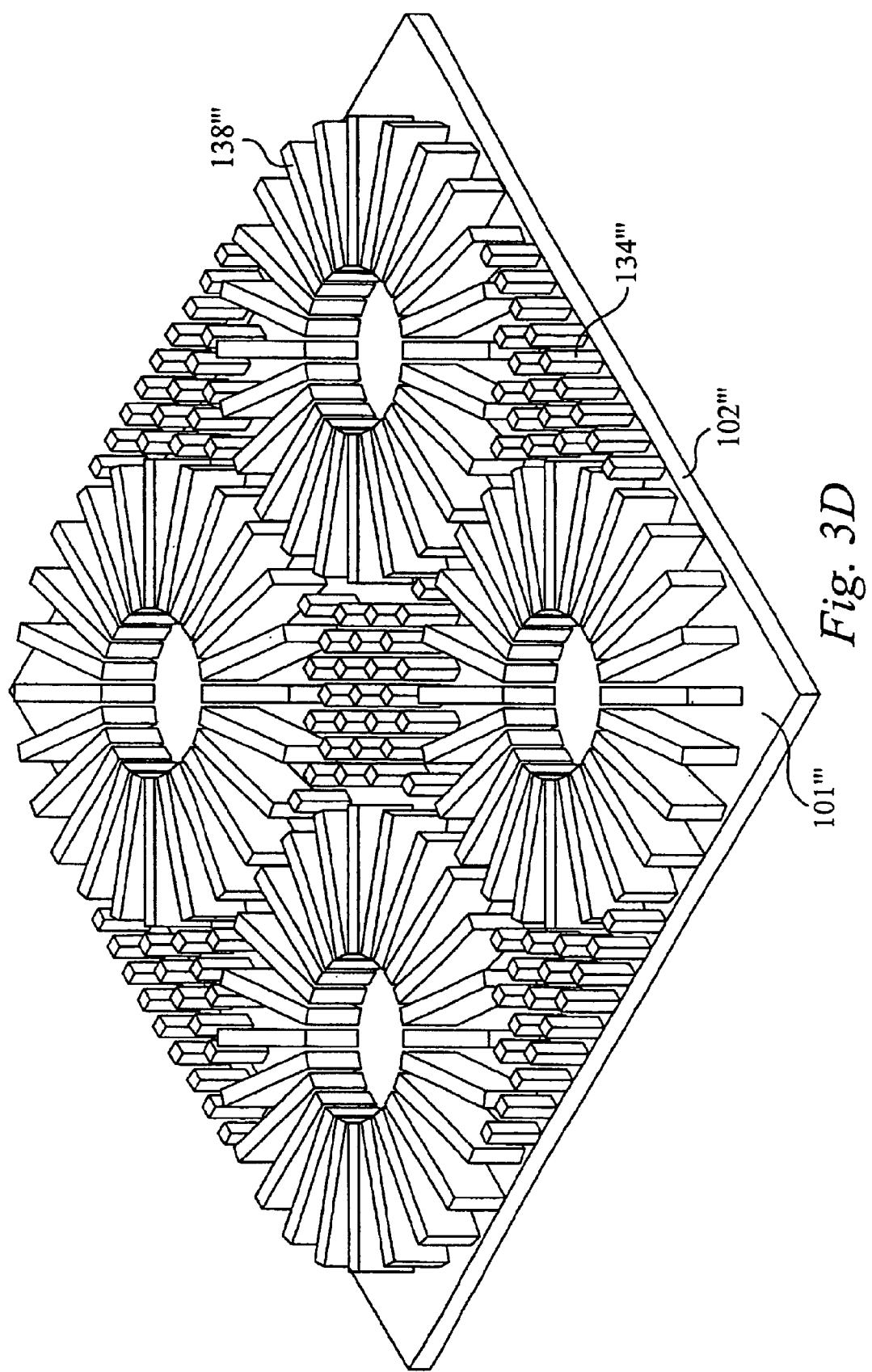
FIG. 3D illustrates a perspective view of the interface layer having several micro-pillars and fins disposed thereon.

For instance, as shown in FIG. 3D, the interface layer 102''' includes several sets of rectangular fins 138''' which are radially disposed with respect to one another in their respective set. In addition, the interface layer 102''' includes several pillars 134''' disposed between the sets of rectangular fins 138'''. It is apparent that the interface layer 102 can include one type of heat transferring feature or alternatively any combination of different heat transferring features (e.g. microchannels, pillars, micro-porous structures).

The interface layer 102 preferably has a high thermal conductivity which minimizes the temperature differences between the heat source 99 and the fluid flowing along the interface layer 102. The interface layer is preferably made from a material having a high thermal conductivity of 100 W/m-K. The heat transferring features preferably have thermal conductivity characteristics of at least 10 W/m-K. However, it is apparent to one skilled in the art that the interface layer 102 and heat transferring features have a thermal conductivity of more or less than the preferred amount and is not limited thereto. More details regarding the interface layer as well as the heat transferring features are discussed in co-pending patent application Serial No. Cool-01301, filed on Oct. 6, 2003, and entitled "METHOD AND APPARATUS FOR EFFICIENT VERTICAL FLUID DELIVERY FOR COOLING A HEAT PRODUCING DEVICE", which is hereby incorporated by reference.

Figure 4A:
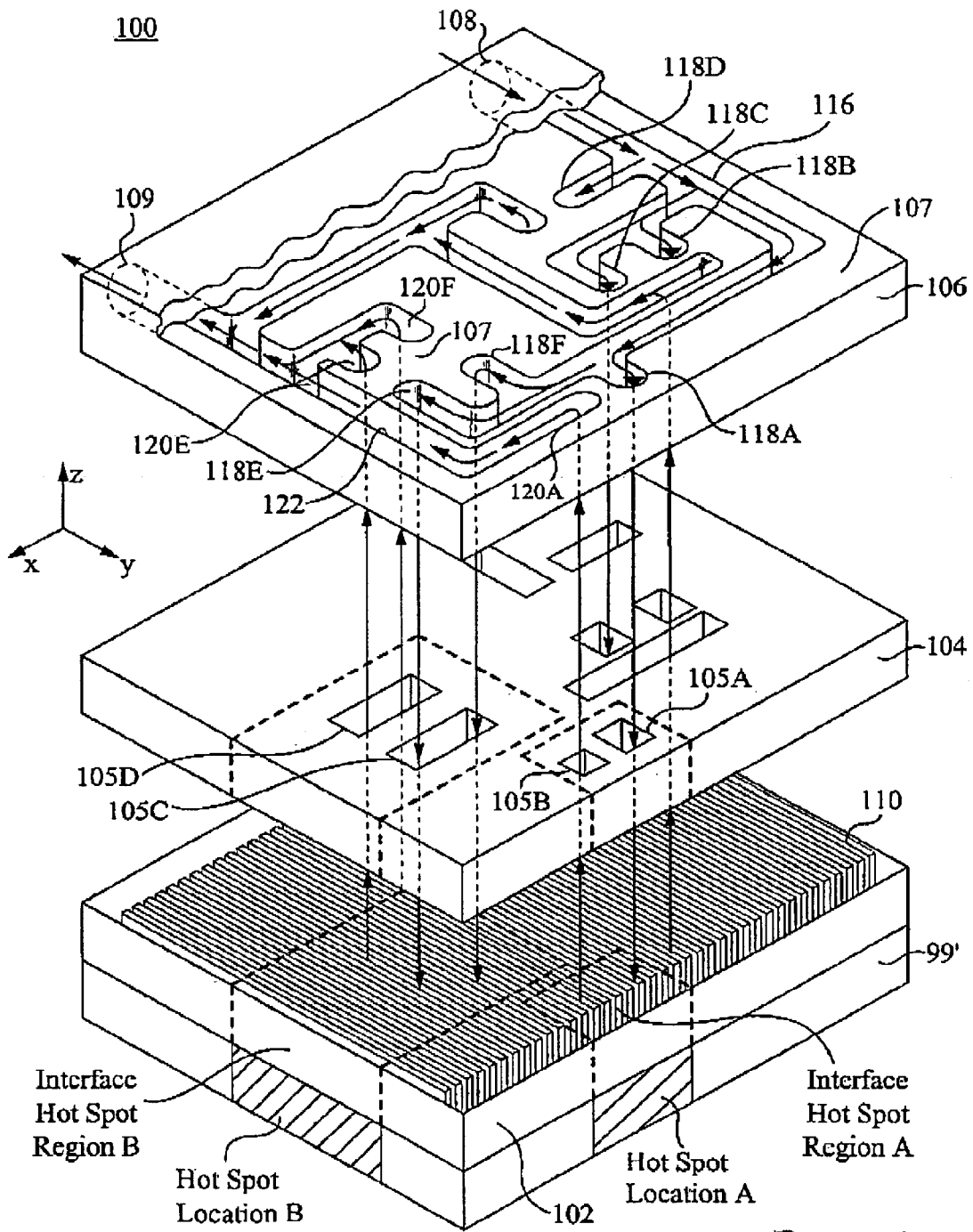
FIG. 4A illustrates an exploded view of one embodiment of the heat exchanger coupled to a heat source in accordance with the present invention.

The cooling system 30 (FIG. 2A) and the heat exchanger 100 of the present invention utilize methods and designs to achieve temperature uniformity and effectively cool hot spots spatially and temporally in the heat source 99'. FIG. 4A illustrates an exploded view of one embodiment of the heat exchanger 100 in accordance with the present invention. As shown in FIG. 4A, the top surface of the manifold layer 106 is partially cut away to illustrate the channels 116, 122 and fingers 118, 120 within the body of the manifold layer 106. As stated above, the locations in the heat source 99' that produce more heat as well as the region that surrounds that location are hereby designated as interface hot spot regions, whereby the locations in the heat source 99' which produce less heat are hereby designated as warm spot regions. As shown in FIG. 4A, the heat source 99' is shown to have hot spot regions at locations A and B. As shown in FIG. 4A, the interface layer 102 includes interface hot spot region A, which is positioned above hot spot location A and interface hot spot region B, which is positioned above hot spot location B.

Figure 4B:
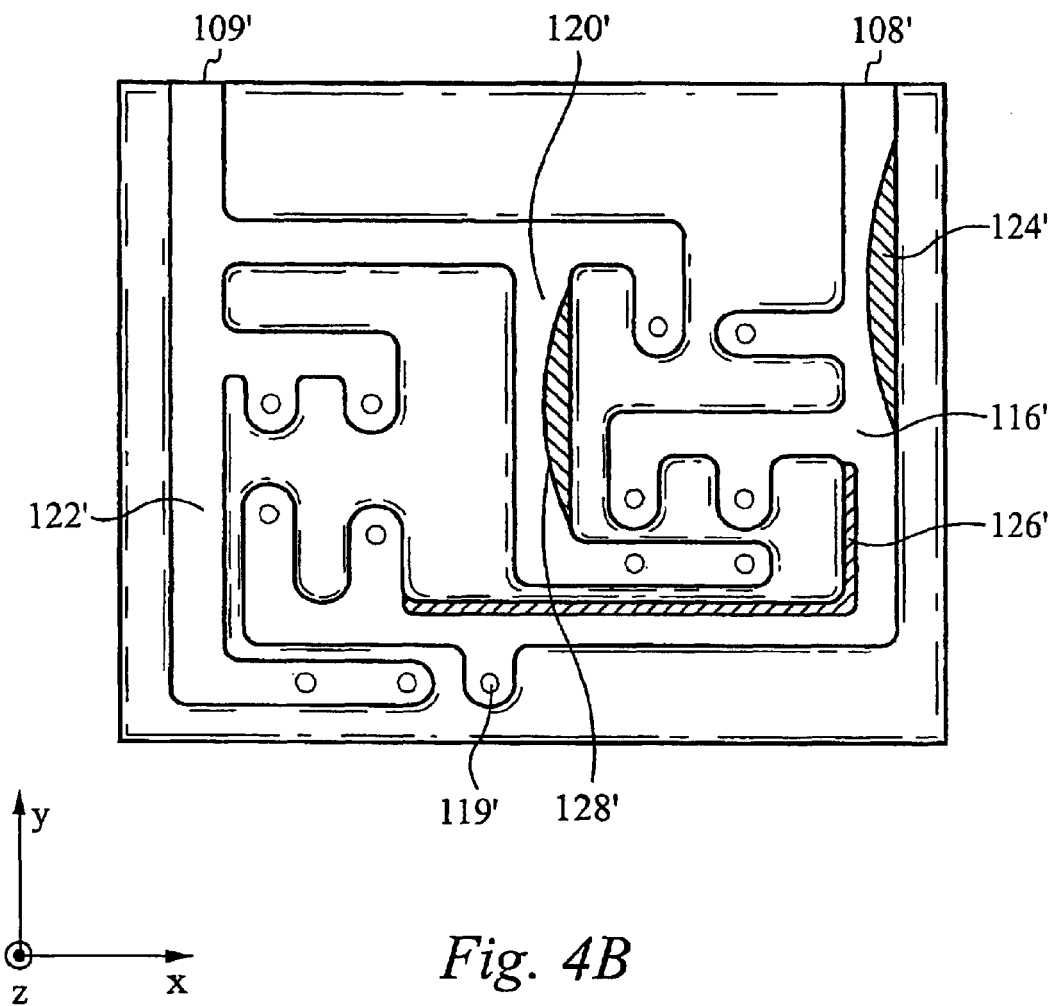
FIG. 4B illustrates a top view of the one embodiment of the heat exchanger with variably moveable fingers coupled to a heat source in accordance with the present invention.

As shown in FIG. 4A, fluid initially enters the heat exchanger 100 through one inlet port 108, although more than one inlet port 108 is contemplated. The fluid then flows to an inlet channel 116. Alternatively, the heat exchanger 100 includes more than one inlet channel 116. As shown in FIGS. 4A and 4B, fluid flowing along the inlet channel 116 from the inlet port 108 initially branches out to finger 118D. In addition, the fluid which continues along the rest of the inlet channel 116 flows to individual fingers 118B and 118C and so on. In the example, fluid is supplied to interface hot spot region A by flowing to the finger 118A, whereby fluid flows down in the Z-direction through finger 118A to the intermediate layer 104. The fluid then flows through an inlet conduit 105A in the interface intermediate layer 104 which is positioned below the finger 118A, to the interface layer 102. The fluid preferably travels along the microchannels 110 as shown in FIG. 4A and undergoes thermal exchange with the heat source 99'. The heated liquid then travels upward in the Z-direction through the conduit 105B to the outlet finger 120A.

Similarly, fluid flows down in the Z-direction through fingers 118E and 118F to the intermediate layer 104. The fluid then flows through the inlet conduit 105C down in the Z-direction to the interface layer 102. The heated fluid then travels upward in the Z-direction from the interface layer 102 through the outlet conduit 105D to the outlet fingers 120E and 120F. The heat exchanger 100 removes the heated fluid in the manifold layer 106 via the outlet fingers 120, whereby the outlet fingers 120 are in communication with the outlet channel 122. The outlet channel 122 allows fluid to flow out of the heat exchanger 100 through one or more outlet ports 109.

Figure 5:
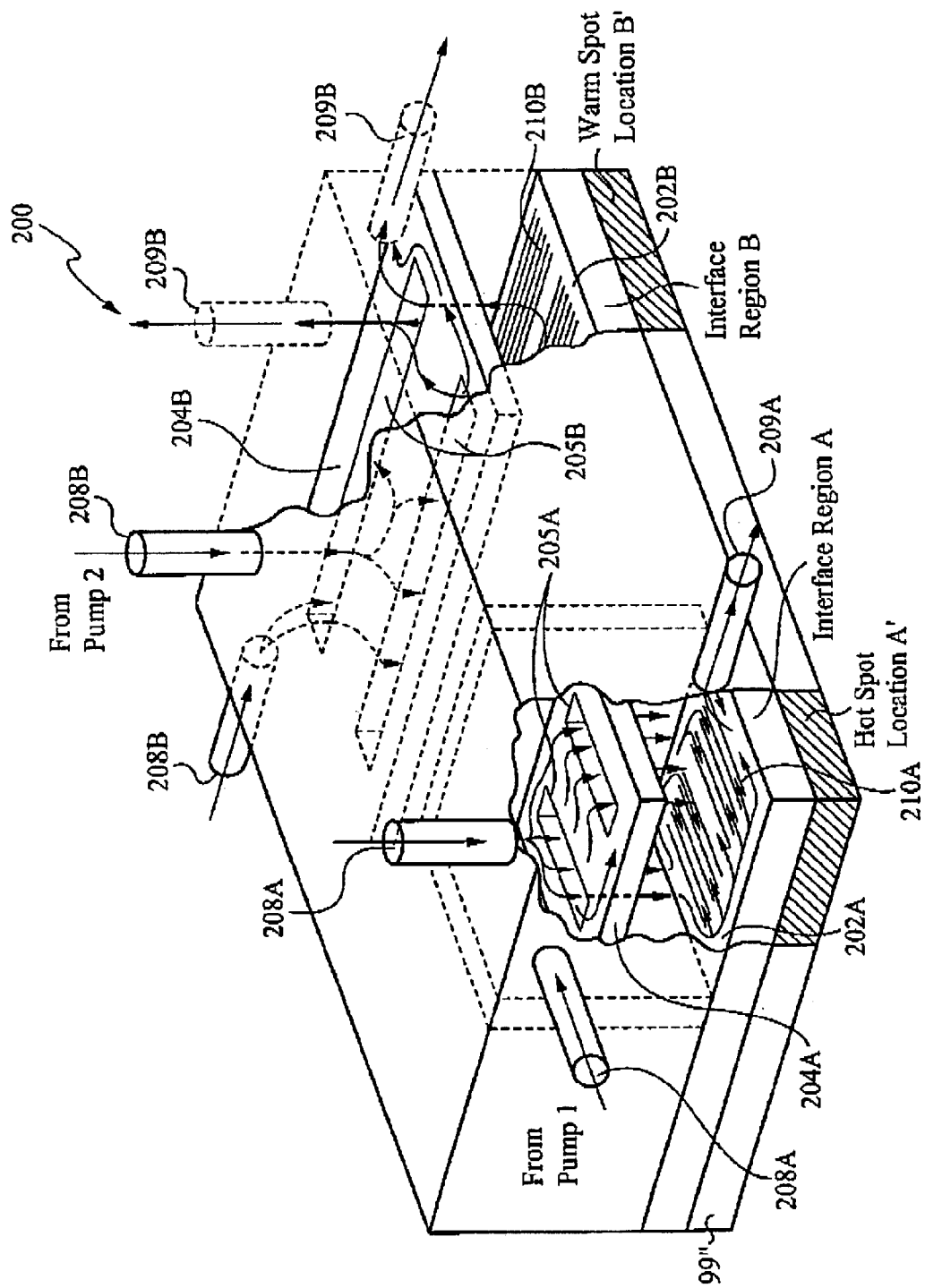
FIG. 5 illustrates a cut-away perspective view of another embodiment of the heat exchanger in accordance with the present invention.

FIG. 5 illustrates a broken-perspective view of another embodiment of the heat exchanger 200 in accordance with the present invention. As shown in FIG. 5, the heat exchanger 200 is divided into separate regions dependent on the amount of heat produced along the body of the heat source 99''. The divided regions are separated by the vertical intermediate layer 204 and/or microchannel wall features 210 in the interface layer 202. Alternatively, the regions in the interface layer 202 are divided by vertical walls which extend between the interface layer and intermediate layer 204, as shown by the dashed lines in FIG. 5. However, it is apparent to one skilled in the art that the assembly shown in FIG. 5 is not limited to the configuration shown and is for exemplary purposes.

The heat source 99" has a hot spot in location A' and a warm spot, in location B', whereby the hot spot in location A' produces more heat than the warm spot in location B'. It is apparent that the heat source 99" alternatively has more than one hot spot and/or warm spot at any location at any given time. Accordingly, more fluid and/or a higher rate of liquid flow is provided to the interface hot spot region A' in the heat exchanger 200 to adequately cool location A'. It is apparent that although interface hot spot region B' is shown to be larger than interface hot spot region A', interface hot spot regions A' and B', as well as any other interface hot spot regions in the heat exchanger 200, can be any size and/or configuration with respect to one another. In one embodiment, the heat exchanger 200 is coupled to two or more pumps, as shown in FIG. 5, whereby each pump 32' (FIG. 2B) provides its own or multiple fluid loops within the heat exchanger 200. Alternatively, each pump 32' (FIG. 2B) contributes to one fluid loop which is controllable by the valve 33'. In an alternative embodiment, the heat exchanger 200 is coupled to one pump 32 (FIG. 2A).

As shown in FIG. 5 the fluid enters the eat exchanger 200 via fluid ports 208A and is directed to interface hot spot region A by flowing along the intermediate layer 204A to the inflow conduits 205A. The fluid then flows down the inflow conduits 205A in the Z-direction into the interface hot spot region A of the interface layer 202A. The fluid flows in between the microchannels 210A whereby heat from location A' transfers to the fluid by conduction through the interface layer 202A. The heated fluid flows along the interface layer 202 in interface hot spot region A' toward exit port 209A where the fluid exits the heat exchanger 200. It is apparent to one skilled in the art that any number of inlet ports 208 and exit ports 209 are utilized for a particular interface hot spot region or a set of interface hot spot regions.

Similarly, the heat source 99" in FIG. 5 has a warm spot in location B' which produces less heat than location A'. Fluid entering through the port 208B is directed to interface hot spot region B' by flowing along the intermediate layer 204B to the inflow conduits 205B. The fluid then flows down the inflow conduits 205B in the Z-direction into interface hot spot region B of the interface layer 202B. The fluid flows and is channeled along the microchannels 210B, whereby heat generated by the heat source in location B' is transferred to the fluid. The heated fluid flows along the entire interface layer 202B in interface hot spot region B and upward to exit ports 209B in the Z-direction via the outflow conduits 205B in the intermediate layer 204B. The fluid then exits the heat exchanger 200 through the exit parts 209B.

In one embodiment the heat exchanger 200 is coupled to one pump 32 as shown in the closed loop system 30 (FIG. 2A). In another embodiment, the heat exchanger 200 is coupled to more than one pump 32', whereby a set of input ports 208A and output ports 209A are coupled to one pump (pump 1) whereas another set of input ports 208B and output ports 209B are coupled to another pump (pump 2). Alternatively, the valve 33' (FIG. 2B) can direct a different amount of flow to port 208A and 208B.

The heat exchanger 200 is designed in one embodiment to keep a desired fraction of the flow separate such that fluid from one pump does not mix with fluid from another pump. Thus, there is more than one independent fluid loop circulating within the heat exchanger 200. In particular, the heat exchanger 200 in FIG. 5 has an independent fluid loop to interface hot spot region A and another independent fluid loop to interface hot spot region B. As discussed in more detail below, the independent loops in the heat exchanger 200 are used to achieve temperature uniformity and effectively cool the hot spots in the heat source 99". The independent fluid loops can be used to supply a consistent amount of fluid to one or more interface hot spot region as well as the remaining portion of the interface layer.

Figure 6:
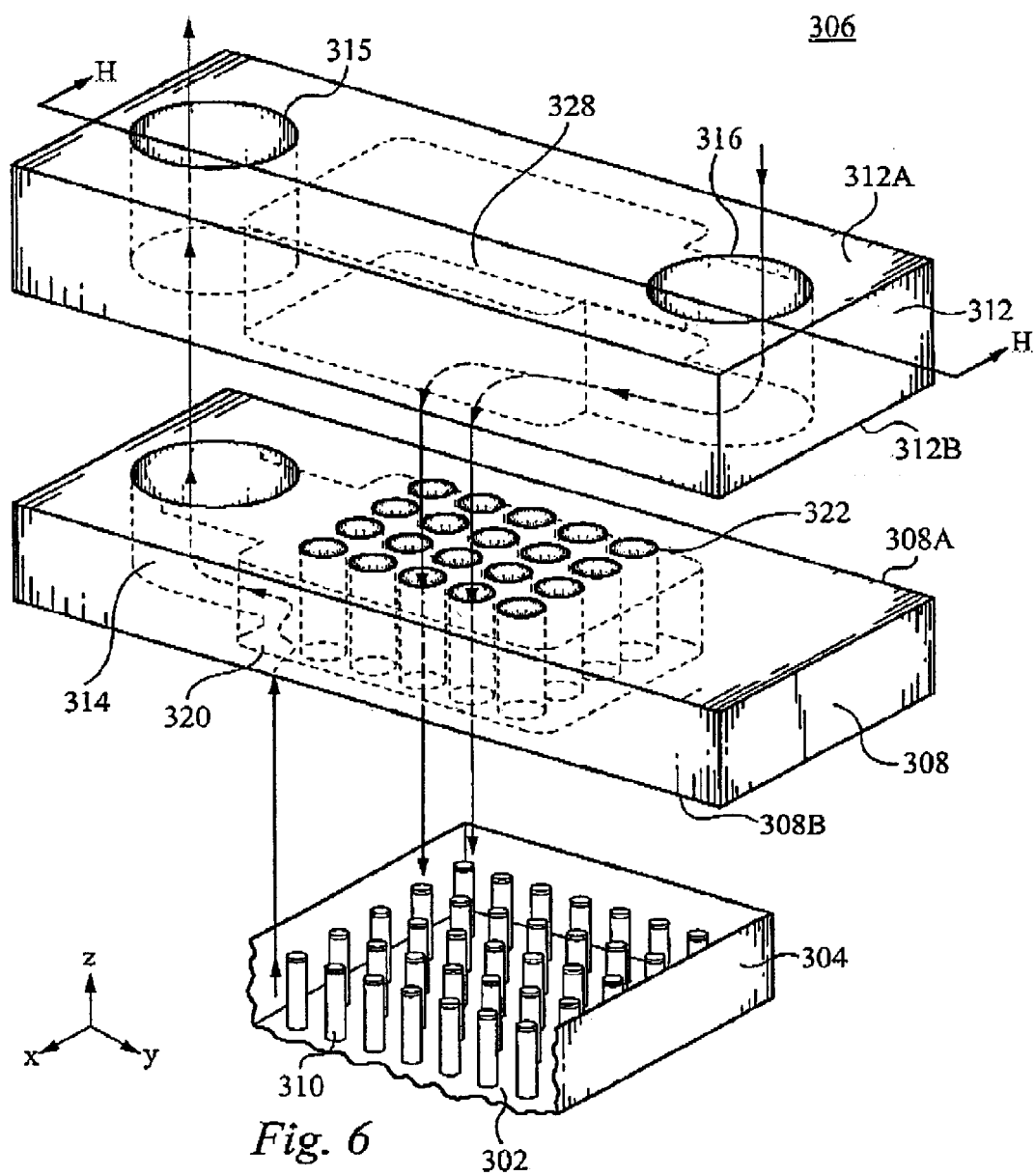
FIG. 6 illustrates an exploded view of the another embodiment of the heat exchanger in accordance with the present invention.

FIG. 6 illustrates an exploded view of another embodiment of the heat exchanger 300 in accordance with the present invention. The manifold layer 306 shown in FIG. 6 includes three individual levels. In particular, the manifold layer 306 includes a circulation level 304, an inlet level 308 and an outlet level 312. Alternatively, the circulation level 304 is not utilized, whereby the interface layer 302 is coupled directly to the inlet level 308. As shown by the arrows in FIG. 6, cooled fluid enters the heat exchanger 300 through the inlet port 315 in the outlet level 312. The cooled fluid travels down the inlet port 315 to the inlet port 314 in the inlet level 308. The fluid then flows into the corridor 320 and flows downward in the Z-direction to the interface layer 302 via the inlet apertures 322 in the circulation level 304. However, the cooled fluid in the inlet corridor 320 does not mix or come into contact with any heated fluid exiting the heat exchanger 300. The fluid entering the interface layer 302 undergoes thermal exchange with the solid material and absorbs the heat produced in the heat source 99. The inlet apertures 322 and outlet apertures 324 are arranged such that the fluid travels the optimal closest distance along the interface layer 302 from each inlet aperture 322 to an adjacent outlet aperture 324. The optimal distance between the inlet and outlet apertures reduces the pressure drop therebetween while effectively cooling the heat source 99. The heated fluid then travels upward in the Z-direction from the interface layer 302 through the inlet level 308 via the several outlet apertures 324 to the outlet corridor 32S in the outlet level 312. Alternatively, the heated fluid travels upward in the Z-direction from the interface layer 302 directly to the outlet corridor 328 in the outlet level 312. The heated fluid, upon entering the outlet corridor 328 in the outlet level 312 flows to the outlet port 316 and exits the heat exchanger 300. The heated fluid does not mix or come into contact with any cooled fluid entering the manifold layer 306 as it exits the heat exchanger 300. It is apparent that the fluid flow shown by the arrows in FIG. 6 is alternatively reversed.

Figure 7A:
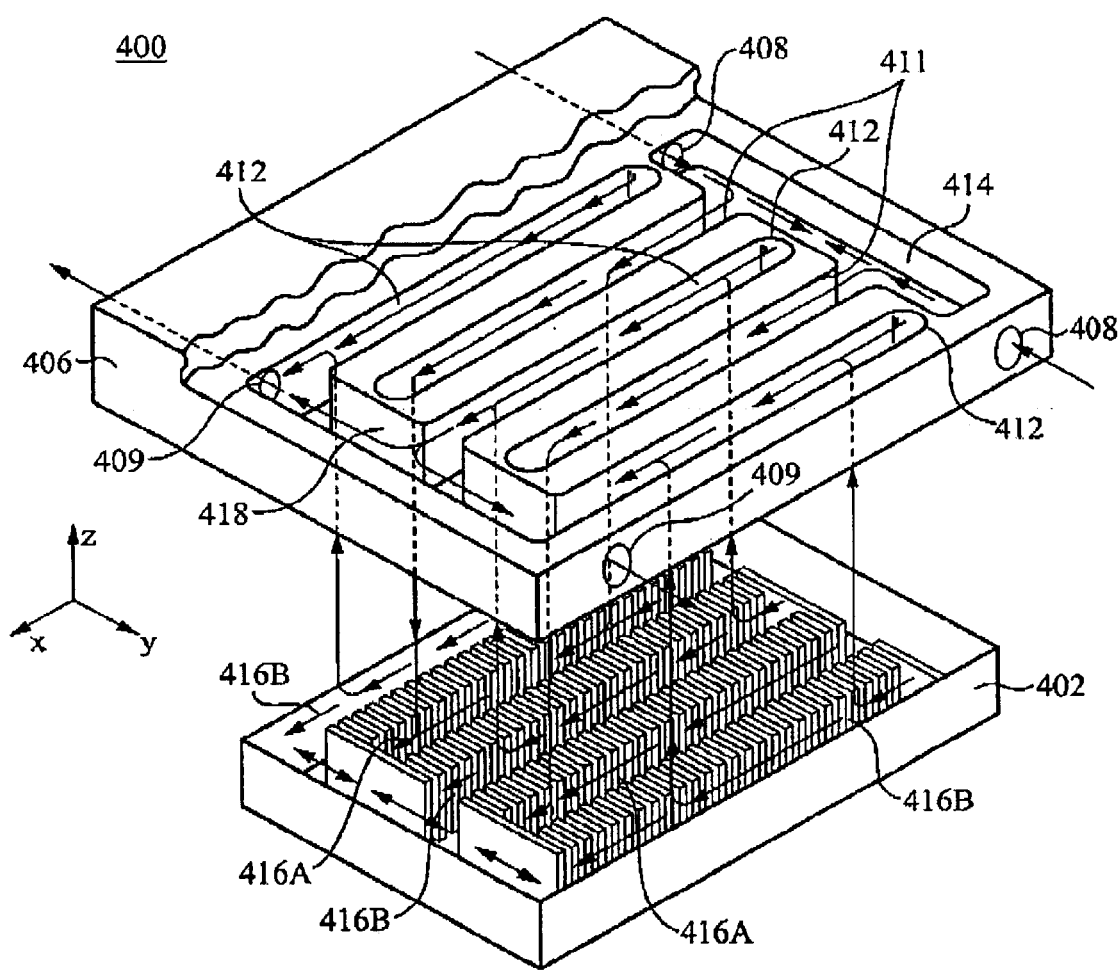
FIG. 7A illustrates a perspective view of another embodiment of the heat exchanger in accordance with the present invention.

FIG. 7A illustrates a perspective view of another embodiment of the heat exchanger 400 in accordance with the present invention. The manifold layer 406 in FIG. 7A includes a plurality of interwoven or inter-digitated parallel fluid fingers 411, 412 which allow one phase and/or two-phase fluid to circulate to the interface layer 402 without allowing a substantial pressure drop from occurring within the heat exchanger 400 and the system 30. 30' (FIGS. 2A–2B). In one embodiment, the inlet fingers 411 are arranged alternately with the outlet fingers 412 in the heat exchange 400.

In general operation, fluid enters the manifold layer 406 at fluid port 408 and travels through the passage 414 and towards the fluid fingers or passages 411. The fluid enters the opening of the inlet fingers 411 and flows the length of the fingers 411 in the X-direction, as shown by the arrows. In addition, the fluid flows downward in the Z direction to the interface layer 402. As shown in FIG. 7A, the fluid in the interface layer 402 traverses along the bottom surface in the X and Y directions and performs thermal exchange with the heat source 99. The heated fluid exits the interface layer 402 by flowing upward in the Z-direction via the outlet fingers 412, whereby the outlet fingers 412 channel the heated fluid to the passage 418 in the manifold layer 406 in the X and Y directions. The fluid then flows along the passage 418 and exits the heat exchanger by flowing out through the port 409.

As stated above, the closed fluid loop 30, 30' (FIGS. 2A–2B) as well as the heat exchanger 100 can be configured to cool hot spots in the heat source 99 and/or achieve an overall temperature uniformity in the heat source 99. In one embodiment, the present invention effectively cools the hot spots by applying a higher flow rate of fluid and/or colder fluid to an interface hot spot region. This is initially described above in relation to the heat exchangers 100, 200, 300, 400 shown in FIGS. 4–7A. For sake of clarity, when referring to all the heat exchangers discussed above, the following discussion will reference heat exchanger 100 generally. However, if specific mention to a particular heat exchanger is needed, the corresponding reference number of that heat exchanger will be denoted.

One method of achieving temperature uniformity in the heat source 99 and effective cooling of hot spots is by controlling the hydraulic and thermal resistances in the heat exchanger 100. Alternatively, another method of reducing temperature differences and achieving effective cooling of hot spots is by configuring the heat exchanger 100 to have variable hydraulic resistance along the manifold layer 106, interface layer 102 and/or intermediate layer 104. Alternatively, another method of reducing temperature variations and achieving temperature uniformity in the heat source 99 is by utilizing multiple pumps or channeling different amounts of flow from one or more pumps to independently cool specific desired areas in the interface layer 102.

Figure 8A:
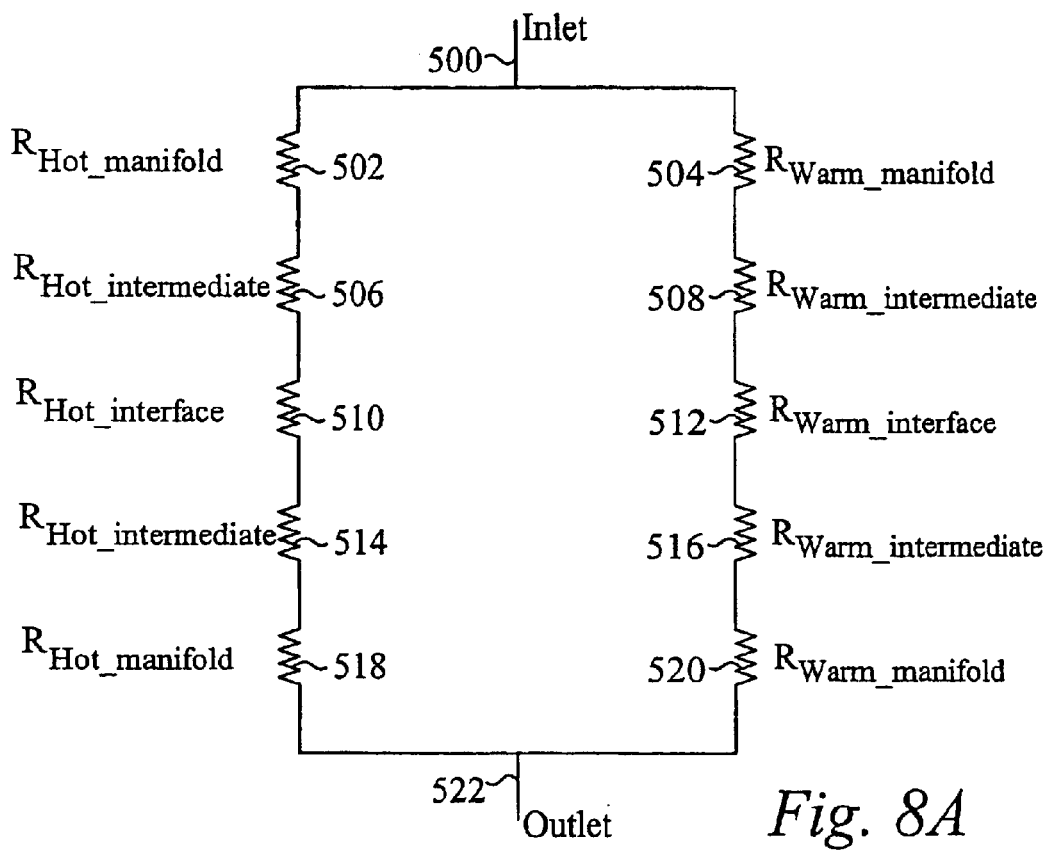
FIG. 8A illustrates a schematic diagram of the thermal resistance to fluid flow circulated to the heat exchanger of the present invention by one pump.

FIG. 8A illustrates a diagram of the hydraulic or fluidic resistances that the fluid potentially experiences in circulating through the heat exchanger. In the example shown in FIG. 4A, the heat exchanger 100 has one interface hot spot region, shown in the left branch in the diagram and one interface warm spot region, shown as the right branch in the diagram. It is apparent to one skilled in the art that the discussion of the resistance diagram in FIG. 8A is alternatively applicable to any other heat exchanger and is not limited to the heat exchanger 100 in FIG. 4A. Although only one hot spot and warm spot resistance branch is shown in FIG. 8A, it is understood that any number of hot spots and cooler spot branches are contemplated.

As shown in FIG. 8A, the fluid enters through the inlet 500 and flows through the manifold layer 106 (FIG. 4A). The features as well as the configuration of the fluid paths in the manifold layer 106 inherently have hydraulic resistances, denoted as $R_{HOT\_MANIFOLD}$ 502 and $R_{WARM\_MANIFOLD}$ 504. In other words, the fluid experiences resistances $R_{HOT\_MANIFOLD}$ 502 and $R_{WARM\_MANIFOLD}$ 504 in the manifold layer 106 in flowing to the interface layer 102. Similarly, fluid flows through the intermediate layer 104 (FIG. 4A), whereby the features and configuration of the fluid paths in the intermediate layer 106 inherently have some hydraulic resistance, denoted as $R_{HOT\_INTERMEDIATE}$ 506 and $R_{WARM\_INTERMEDIATE}$ 508. Thus, the fluid experiences resistances $R_{HOT\_INTERMEDIATE}$ 506 and $R_{WARM\_INTERMEDIATE}$ 508 in flowing to the interface layer 102. The fluid flows to and along the interface layer 102 (FIG. 4A), whereby the features and configuration of the fluid paths in the interface layer 102 inherently have some resistance, denoted as $R_{HOT\_INTERFACE}$ 510 and $R_{WARM\_INTERFACE}$ 512, whereby the fluid experiences resistances $R_{HOT\_INTERFACE}$ 510 and $R_{WARM\_INTERFACE}$ 512 in the interface layer 102. The heated fluid then flows up through the intermediate layer 104 and the manifold layer 106, whereby the heated fluid experiences resistances $R_{HOT\_INTERMEDIATE}$ 514, $R_{WARM\_INTERMEDIATE}$ 516 and $R_{HOT\_MANIFOLD}$ 518, and $R_{WARM\_MANIFOLD}$ 520 in the intermediate layer 104 and manifold layer 106, respectively. The heated fluid then flows out of the heat exchanger 100 through the outlet 522.

Figure 8B:
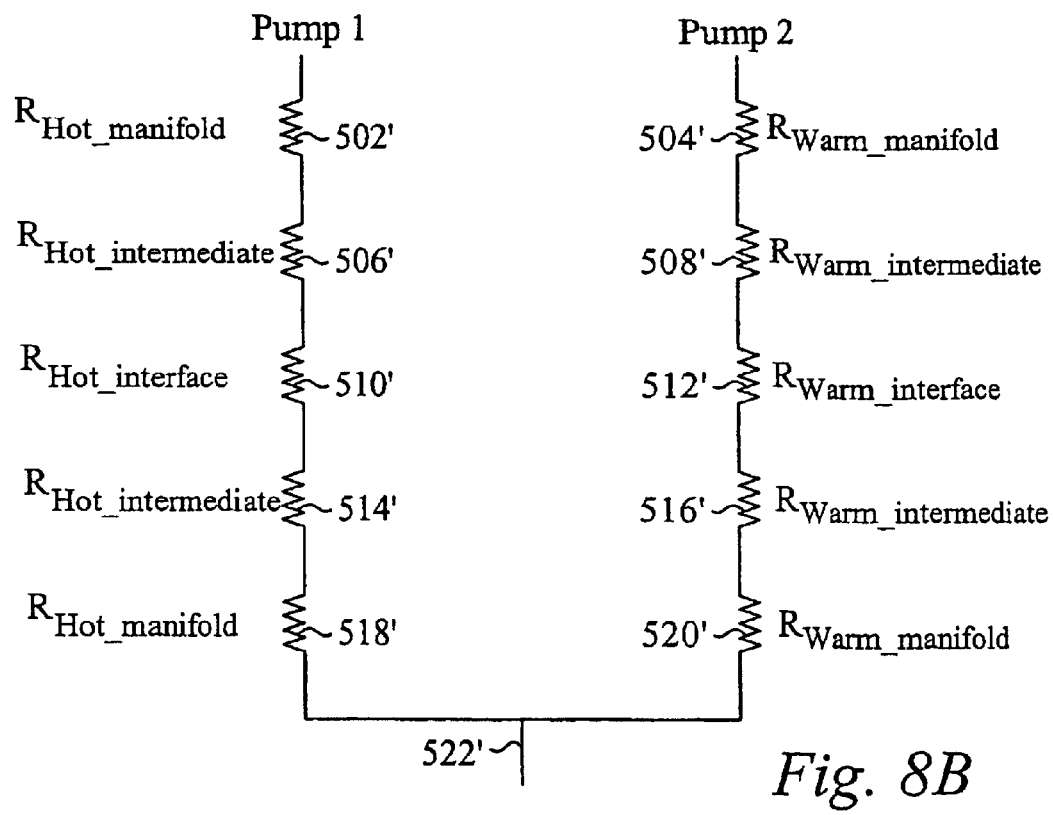
FIG. 8B illustrates a schematic diagram of the thermal resistance to fluid flow circulated to the heat exchanger of the present invention by multiple pumps.

FIG. 8B illustrates a resistance diagram of the hydraulic resistance that the fluid potentially experiences in circulating through the heat exchanger. Although only one hot spot and warm spot resistance branch is shown in FIG. 8B, it is understood that any number of hot spots and cooler spot branches are contemplated. The resistance diagram in FIG. 8B is conceptually the same as that shown in FIG. 8A, although the two fluid pumps are coupled to the heat exchanger 100. As shown in FIG. 8B, Pump 1 circulates fluid to the hot spots, whereby the fluid flowing to and from the interface hot spot region is subjected to the individual resistances in the heat exchanger. Similarly, Pump 2 circulates fluid to the cooler regions (e.g. warm spots), whereby the fluid flowing to and from the cooler regions is subjected to the individual resistances in the heat exchanger.

With regard to FIG. 8A, the heat exchanger 100 of the present invention can be configured such that the hydraulic and thermal resistances are independently or collectively controlled to reduce temperature differences and achieve temperature uniformity in the heat source 99 and effective hot spot cooling. For example, more than one pump is employed in the system 30' (FIG. 2B), whereby more and/or colder fluid is channeled to the hot spot region and less and/or warmer fluid is channeled to the warm spot regions. Therefore, the heat exchanger 100 is configured to have a lower hydraulic resistance along the hot spot branch, $R_{HOT\_MANIFOLD}$ 502, $R_{HOT\_INTERMEDIATE}$ 506, $R_{HOT\_INTERFACE}$ 510, whereas the heat exchanger is configured to have a higher resistance in the warm spot branch, $R_{WARM\_MANIFOLD}$ 504, $R_{WARM\_INTERMEDIATE}$ 516 and $R_{WARM\_INTERFACE}$ 512. The thermal resistance is also controllable to allow the fluid channeled to the hot spot to undergo better thermal exchange and heat absorption than fluid channeled to the cooler region, as discussed in more detail below.

This is shown specifically in the heat exchanger 200 in FIG. 5 as well as the resistance diagram in FIG. 8B, in which one pump (Pump 1) circulates fluid to interface region A and another pump (Pump 2) circulates fluid to interface region B. Although the fluid from the multiple pumps can be mixed at any point in the heat exchanger 200, the two fluid lines are alternatively kept separate from one another within the heat exchanger 200. Therefore, multiple independent cooling loops are established in the heat exchanger 200, whereby the characteristics of the heat source cooling and fluid flow are controllable to achieve effective cooling and reduce temperature variations.

The methods and designs in controlling or varying the hydraulic and thermal resistances are discussed in more detail below. It should be noted that the hydraulic resistance is controllable in any of the layers or levels in the heat exchanger and the thermal resistance is controllable in the interface layer. In addition, it is apparent to one skilled in the art that any combination of the designs and methods are alternatively incorporated in the system and heat exchanger to reduce temperature differences and achieve temperature uniformity in the heat source 99.

Figure 7B:
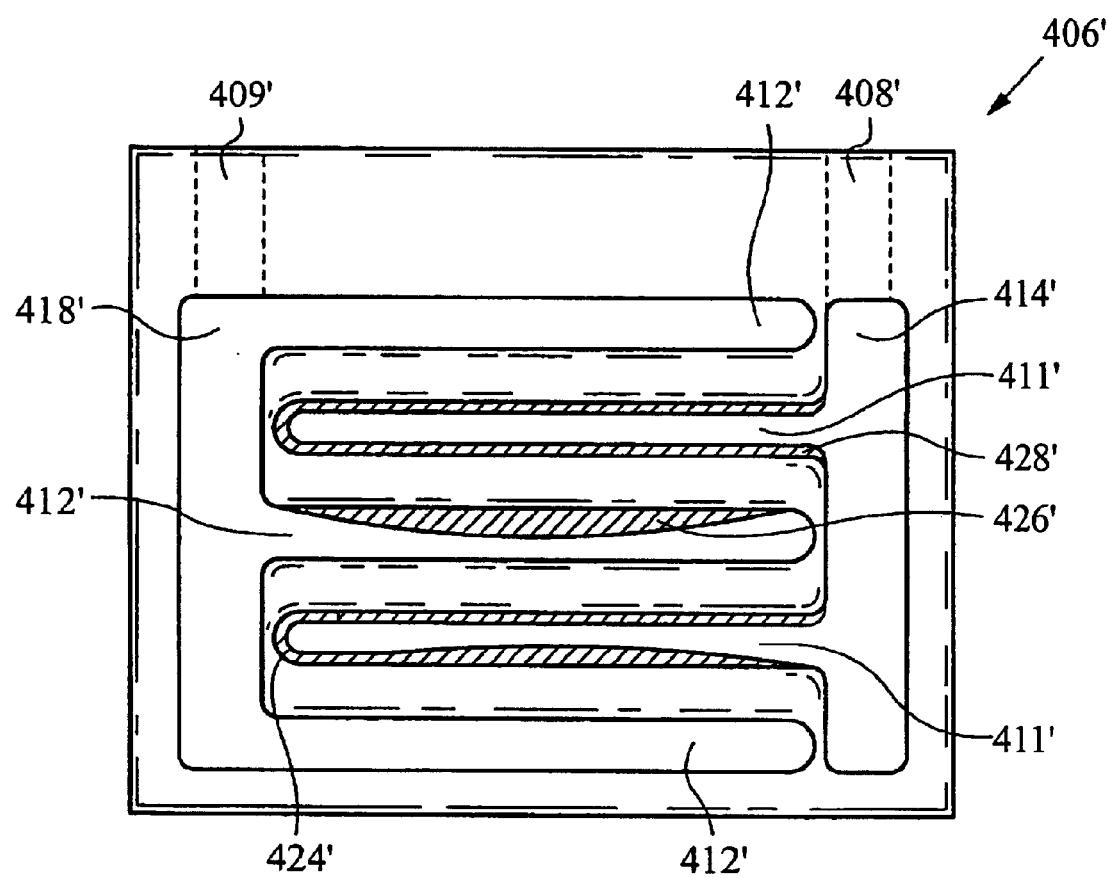
FIG. 7B illustrates a top view of the one embodiment of the heat exchanger with variably moveable fingers coupled to a heat source in accordance with the present invention.

The individual features and designs in the manifold layer 106 and intermediate layer 104 can be individually or collectively varied to control the hydraulic resistance in the heat exchanger 100. In the manifold layer 106, the geometries and cross-sectional dimensions of the fingers 118, 120 and channels 116, 122 are tailored to provide a specific hydraulic resistance. In the intermediate layer 104, the geometries and cross sectional dimensions of the conduits 105 are tailored to provide a specific desired hydraulic resistance. For example, a particular finger 118, 120 in the manifold layer 106 preferably has a larger cross sectional dimension along the location above the interface hot spot region, whereas the fingers 118, 120 above the warm interface region has a smaller cross sectional dimension. This cross sectional area variation enhances cooling capacity to hot spots. As shown in FIG. 4B, the width or hydraulic dimension of the channels 116, 122 are variable along the length of the manifold layer 106. In one embodiment, the larger hydraulic dimensions of the channels 116, 122 are positioned above the interface hot spot regions and the narrower hydraulic dimensions of the channels 116, 122 are positioned above the cooler regions. Therefore, more flow is allowed to pass over the hot spot than over the warm spot at a given time. In one embodiment, as shown in FIGS. 4B and 7B, the channels and/or fingers have fixed or varying hydraulic dimensions which are permanently designed into the manifold layer 106. Alternatively, the variable hydraulic channels and/or fingers are dynamically adjustable as discussed in more detail below.

The vertical dimensions of the fingers 118, 120 and/or channels 116, 122 are alternatively variable to accommodate hot spot cooling and temperature uniformity in the heat source 99. Channels 116, 122 and/or fingers 118, 120 in the manifold layer 106 which have longer side walls allow more fluid to directly travel vertically to the interface layer 102. In contrast, fingers in the manifold layer 106 that do not have vertical walls which extend down to the interface layer 102 allow more fluid to travel horizontally across the interface layer instead of directly striking the interface layer 102. For example, a section of a finger 118, 120 above an interface hot spot region has longer side walls than other sections of that particular finger 118, 120. Thus, the longer side walls allow fluid to be more directly applied to a concentrated area in the interface hot spot region, whereas the shorter side walls allow the fluid to be applied over a greater area in the interface layer. It should be noted that the above discussion of the varying dimensions of the fingers 118, 120 and channels 116, 122 also apply to the other embodiments discussed and is not limited to the embodiment discussed above.

In addition, the heat exchanger 100 is alternatively designed to control the hydraulic resistance $R_{INTERFACE}$ in the interface layer 102 to accommodate temperature uniformity and hot spot cooling in the heat source 99. Preferably, the heat transferring features in the interface layer 102 which are located above or near the interface hot spot regions will have less hydraulic resistance than heat transferring features in other areas in the interface layer 102. Therefore, more fluid is allowed to pass over the interface hot spot region than over the other areas of the interface layer at a given time, because less hydraulic resistance is present at the interface hot spot region.

The hydraulic resistance in a fluid pathway in the interface layer 102 is controlled by optimizing the hydraulic dimensions of the heat transferring features. For instance, the hydraulic diameter of microchannels 110 are configureable to control the fluid flow rate along the length of the microchannels 110. Thus, one or more microchannels in the interface layer 102 has a larger diameter over the interface hot spot regions than the remaining portions of the microchannels 110. Therefore, the larger diameter microchannels 110 will allow more fluid to pass over the interface hot spot regions than the smaller diameter microchannels 100 having more resistance. Alternatively, the pillars 134 are positioned apart from each other to control the amount of hydraulic resistance upon the fluid flowing along the interface layer 102. Thus, each of the pillars 134 at an interface hot spot region can be positioned farther apart than pillars above a warm spot region, such that more fluid is able to flow over the interface hot spot region than the warm spot region at a given time. It is apparent that the dimension of the hydraulic diameters should be optimized in light of the amount of pressure drop created in the interface layer 102 and the amount of surface area for conduction provided by the heat transferring features.

The hydraulic resistance in a fluid pathway along the interface layer 102 can alternatively be altered by optimizing the length of the fluid pathway. It is well known that the amount of hydraulic resistance increases as the length of the fluid path increases. Therefore, the length of the fluid path can be optimized to minimize the hydraulic resistance along the interface layer 102 while maintaining the pressure characteristics of the fluid. In one example, microchannels 110 located at an interface hot spot region have a smaller channel length in comparison to microchannels 110 at a warm hot spot region. Therefore, fluid traveling over the interface hot spot region flows a shorter distance along the microchannel 110 fluid paths and experiences less hydraulic resistance before exiting the interface layer, whereas the longer microchannels 110 force the fluid to travel a longer distance and cause the fluid to gradually heat up while flowing along the interface layer. It should be noted that although the length of the fluid path is optimized for single phase flow, the length of the fluid path of the microchannel 110 is alternatively made longer to induce two phase flow, as discussed in more detail below.

In another embodiment, the heat exchanger 100 can be configured to control the thermal conductivity characteristics in the interface layer 102 to accommodate temperature uniformity and hot spot cooling in the heat source. In particular, the heat transferring features discussed above are configured to control the ability to transfer to heat from the heat transferring features to the fluid. Thus, the heat transferring features as well as the interface layer 102 itself can be configured to have one or more locations in the interface layer 102 which have a higher thermal conductivity compared to other locations in the interface layer 102.

Figure 1A:
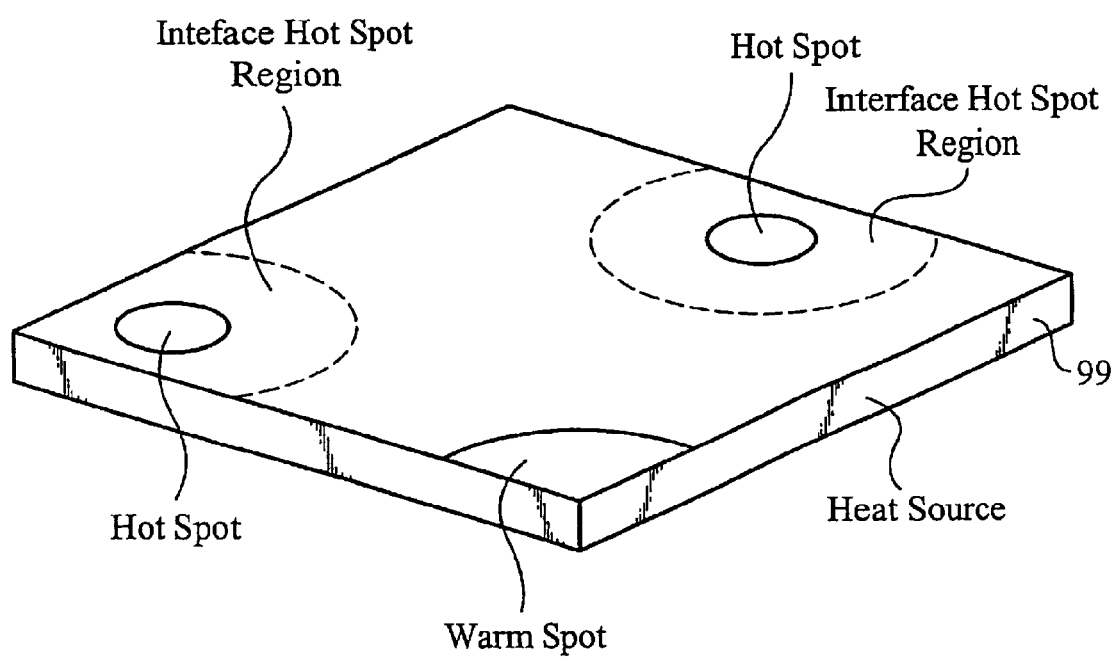
FIG. 1A illustrates a perspective view of a heat source having multiple hot spots marked thereon.
Figure 1B:
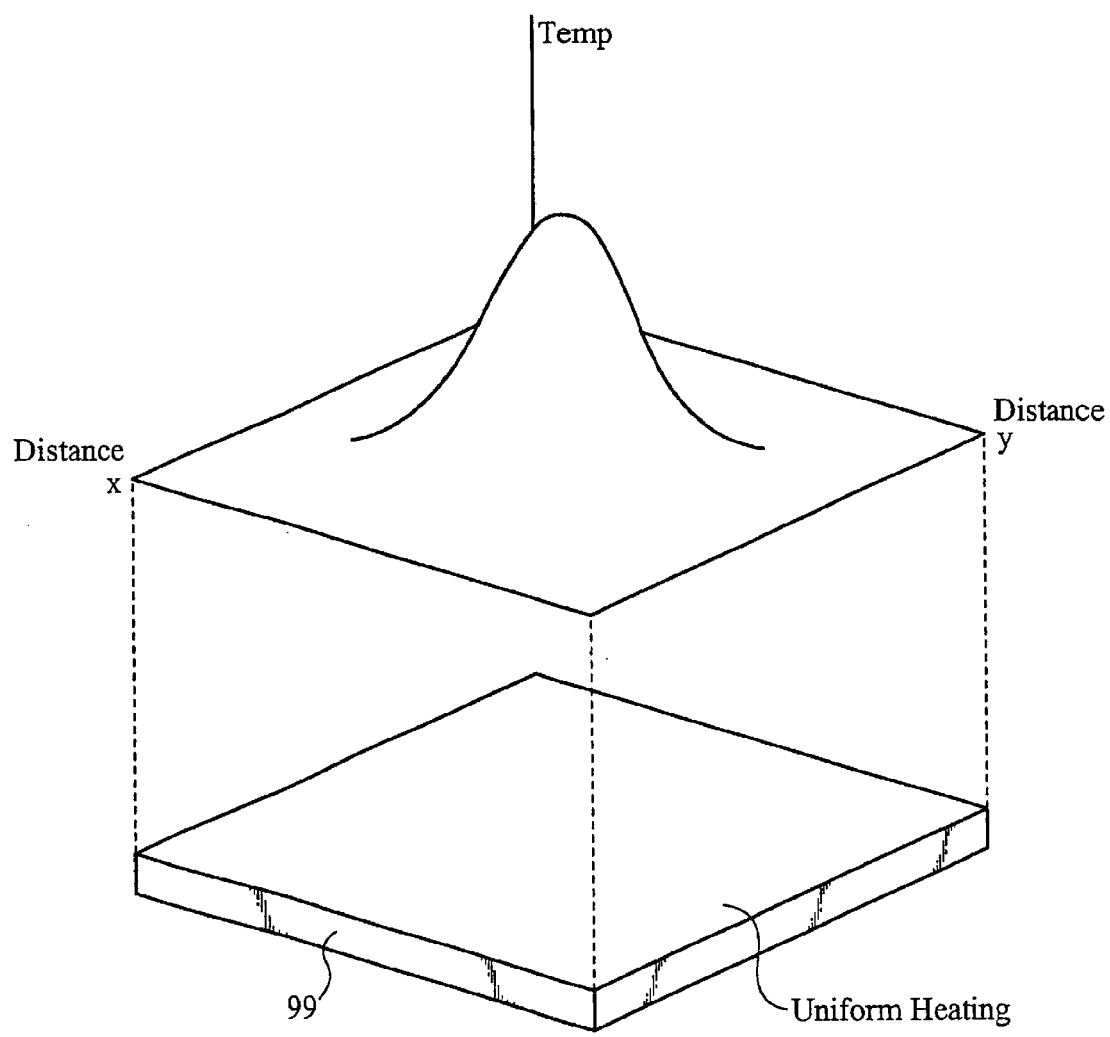
FIG. 1B illustrates a Temperature-Position graph of a typical heat source having uniform heating.

One application of controlling the thermal conductivity in the interface layer 102 and/or heat transferring features 110 is to form the interface layer 102 and/or heat transferring features 110 out of appropriate materials which have corresponding thermal conductivity values. For instance, a heat source 99 not having any hot spots will generate a higher heat flux in the center, as shown in FIG. 1B. To achieve temperature uniformity in the heat source 99 shown in FIG. 1B, the interface layer 102 and/or heat transferring features are formed to provide a higher thermal conductivity in the center of the interface layer 102. In addition, the thermal conductivity properties of the interface layer 102 and/or heat transferring features 110 gradually decreases away from the center, such that the entire heat source 99 is cooled to a substantially uniform temperature.

In addition, the thermal resistances in the heat exchangers 100 are alternatively controlled by selectively adjusting the surface to volume ratio of the heat transferring features in the interface layer 102. By increasing the surface to volume ratio of the features or interface layer 102 itself, the thermal resistance of the features and/or interface layer 102 is reduced. One example of increasing the surface to volume ratio within the interface layer 102 includes configuring the interface layer 102 to have more a greater density of heat transferring features per unit area. For example, as shown in FIG. 3B, the microchannels 110 and 111 are positioned closely to one another whereas microchannels 113 are located a further distance away from microchannels 110 and 111. The microchannels 110 and 111 will provide less thermal resistance to the fluid than the spaced apart microchannels 113 due to the greater surface to volume ratio of heat transferring features in the interface layer 102'. In an application in which a microporous structure 136 (FIG. 3B) is disposed on the interface layer 102', the thermal resistance of the microporous structure is reduced by utilizing smaller pore sizes.

In another example shown in FIG. 3C, the heat source 99 has a hot spot in each corner. Thus, the interface layer 102" correspondingly includes an interface hot spot region in each corner as shown in FIG. 3C. The interface layer 102" can be configured to achieve temperature uniformity in the heat source 99 by reducing the thermal resistance along the outer corners of the interface layer 102". The interface layer 102" thereby has a greater number of pillars 134 positioned near the outer edges of the bottom surface 101, whereby a smaller density of pillars 134 are positioned near the center, as shown in FIG. 3C. The greater density of pillars 134 thereby provides a greater surface to volume ratio and a lower thermal resistance in the outer corners of the interface layer 102". It should be noted that the design shown in FIG. 3C is only one example and is not limited to the design shown therein. It should be also noted that the dimensions and volume of pillars 134 are optimized such that the fluidic resistance along the interface does not become larger than the thermal resistance.

Another example of increasing the surface to volume ratio within the interface layer 102 is to design the heat transferring features 110 at or near the interface hot spot region to have a vertical dimension that is larger than the vertical dimension of other features in the remaining areas of the interface layer 102'. As shown in FIG. 3B, the heat source 99 has a large hot spot along the front half of the body. Accordingly, to achieve effective cooling of the heat source 99, the microchannel 111 and pillars 134 have a greater vertical height near the front half of the interface layer 102', whereas the microchannel 111 and pillars 132 have a smaller vertical height near the rear half of the interface layer 102'.

Figure 9:
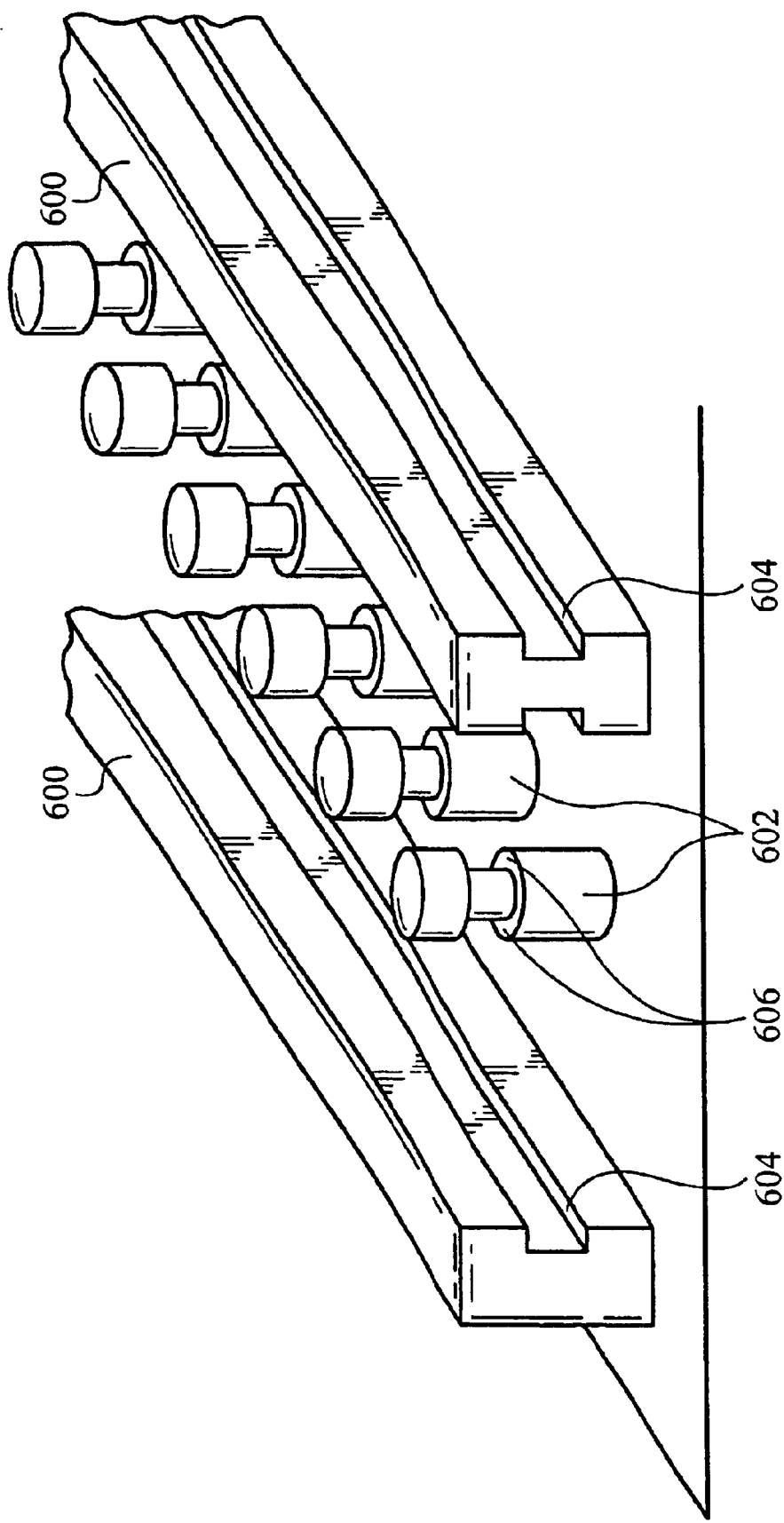
FIG. 9 illustrates a perspective view of microchannels and micro-pillars having a cut-away feature in accordance with the present invention.

In two phase flow scenarios, the surface to volume ratio of the heat transferring features are alternatively increased by modifying the shape of the feature to have a greater surface area which the fluid is in contact with. For example, as shown in FIG. 9, the microchannels 600 include a longitudinal slot 604 extending into the side of the walls 600. In addition, the pillars 602 include a notch 606 cut out from the body of the pillar 602. The slots 602 in the microchannels 600 provide additional surface area for the fluid to come into contact with. Similarly, the notches 606 in the pillars 602 provide additional surface area for the fluid to come into contact with. The additional surface area provides more space for heat to transfer to the fluid, thereby reducing the thermal resistance in the interface layer. The additional surface area from the slots 604 and notches 606 reduces superheating and promote stable boiling of the fluid in the vicinity of the hot spots in two phase flow. It is apparent that the heat transferring features alternatively have any other configuration to provide an increased surface area to the fluid and the increased surface features shown on the microchannels 600 and pillars 602 in FIG. 9 are exemplary.

In two phase flow scenarios, the heat transferring features are additionally configureable such that the surfaces of the heat transferring features are roughened a certain degree at locations where more heat transfer is desired. A roughened surface creates pockets which bubbles from the liquid form within, whereby surface tension along the surface holds the bubbles to the roughened surface. For instance, by changing the roughness of a microchannel walls 110, the surface tension along the microchannel walls 110 is changed, thereby increasing or decreasing the amount of vapor pressure needed to initiate boiling of the liquid. A surface which is substantially rough will require less vapor pressure to initiate boiling, whereas a substantially smooth surface will require more vapor pressure to initiate boiling. In a two phase flow scenario, boiling is desired at interface hot spot regions to achieve effective cooling of the hot spot, as discussed in more detail below. Therefore, the heat transferring features 110 as well as the interface layer 102 can have a roughened surface achieve effective cooling of the hot spot.

The desired surface or surfaces in the interface layer 102 are roughened using conventional surface altering methods. Alternatively, the desired surface or surfaces in the interface layer 102 are roughened by applying a coating to the desired surface. The surface coating applied to the interface layer 102 and/or heat transferring elements 110 modifies the surface tension of the surface. In addition, the surface coating is alternatively applied to modify the contact angle at which the two phase fluid comes into contact with the surface. The surface coating is preferably the same material applied to alter the thermal conductivity of the interface layer 102 and/or heat transferring features, whereby the thermal conductivity of the coating is at least 10 W/m-K. Alternatively, the surface coating is made of a material different than the material of the interface layer 102.

In addition to controlling the cooling ability of the heat exchanger 100 by altering the thermal and hydraulic resistances, the heat exchanger 100 also achieves temperature uniformity and hot spot cooling in the heat source 99 by exploiting the temperature-dependent viscosity characteristics of the fluid. As known in the art, the viscosity of most fluids decreases with increasing temperature, whereby the fluid becomes less resistive to flow as the fluid temperatures increases. Therefore, hotter areas in the interface layer 102 will naturally draw more fluid thereto than cooler areas due to this reduced hydraulic resistance and viscosity.

In one embodiment, the heat exchanger 100 of the present invention utilizes this property of the fluid in its design. In particular, the heat exchanger initially directs the fluid to the interface hot spot regions, wherein heat transfer from the hot spots will naturally cause the fluid to increase in temperature. As the temperature of the fluid increases, the fluid itself will become less viscous. For example, the heat exchanger 100 is configureable to initially channel fluid to hotter areas in the interface layer 102 to increase the fluid temperature. The heated, less viscous fluid is then channeled at a faster flow rate to the remaining areas of the interface layer 102. Although the fluid is heated to reduce its viscosity, the heating of the fluid can cause the fluid to boil and accelerate as vapor, thereby causing a substantial increase in the pressure drop along the interface layer 102. In one embodiment, the heat exchanger 100 compensates for the potential pressure drop by constricting the flow and preventing the fluid from accelerating. This is performed using a variety of methods, such as designing the fluid paths to have very narrow pores, channels and/or spaces between the heat transferring features or utilizing multiple pumps, as discussed above. In another embodiment, as discussed below, the fluid is purposely allowed to undergo boiling to further cool desired areas in the interface layer 102.

In another embodiment, the heat exchanger 100 of the present invention includes an internal valving mechanism to achieve temperature uniformity and perform effective cooling of hot spots in the heat source 99. In particular, the internal valving mechanism in the heat exchanger 100 controls the fluid flow to selected regions in the interface layer 102. The internal valving mechanism in the heat exchanger 100 dynamically controls the hydraulic and thermal resistance along the fluid path to achieve desired cooling effects in the system 30, 30' (FIGS. 2A–2B). It is apparent to one skilled in the art that the internal valving mechanism of the heat exchanger 100 allows the system 30, 30' to control the fluid flow rate as well as the amount of flow in the heat exchanger 100. Further, the internal valving mechanism is alternatively utilized to control the phase characteristics as well as any pressure-dependent or viscosity dependent characteristics of the fluid in the heat exchanger 100.

FIGS. 4B and 7B illustrate alternative embodiments of the manifold layer 106', 406' having multiple internal valves configured within. As shown in FIG. 4B, the manifold layer 106' includes an expandable valve 124' along the channel wall 116' near the inlet port 108' as well as another expandable valve 126' which extends around the corner along the inlet channel 116'. In addition, the manifold layer 106' includes an expandable valve 128' in the outlet finger. The valves 124' and 128' are shown in FIG. 4B to be expanded, whereas the valve 126' is shown to be contracted. The fluid experiences higher hydraulic resistance at valves 124' and 128' due to the reduced fluid path dimension which the fluid can flow through. In addition to constricting the flow at the valve 124' location, the expanded valve 124' also controls the flow rate as well as the amount of flow which is channeled to the remaining portion of the inlet channel 116'. For instance, the amount of fluid will increase at aperture 119' as the valve 124' is contracted, because the fluid path at the valve 124' is increased in dimension. The expanded valve 128' in the outlet finger 120' also controls the flow rate as well as the amount of flow which is channeled to the remaining portion of the outlet finger 120'. The valve 126', as shown in FIG. 4B, provides smaller hydraulic resistance to the fluid than valve 124', although the valve 126' is also expandable to increase the hydraulic resistance to the fluid.

As shown in FIG. 7B, the manifold layer 406' includes expandable valves 424' and 428' coupled to the inside walls of inlet fingers 411'. In addition, the manifold layer 406' includes an expandable valve 426' coupled to one side in the outlet finger 412'. Although the some of the valves in FIGS. 4B and 7B are shown to be entirely expanded or contracted, portions of the valve 424' alternatively expand and/or contract independently of one another. For example, as shown in FIG. 7B, one side of the valve 424' is expanded whereas the other side of the valve 424' is contracted. In contrast, the entire valve 426' in FIG. 7B is substantially expanded, whereas the entire valve 428' is contracted. Although not shown, the expandable valves are alternatively disposed along any channel or fluid path in the manifold layer. Although not shown, one or more expandable valve are alternatively configured within the apertures 322, 324 in the heat exchanger 300 in FIG. 6. Alternatively, the expandable valves are configured in the conduits 105 in the intermediate layer 104. Alternatively, the expandable valves are configured along the interface layer 102. In addition, the valve can be placed uniformly along the wall surface, as shown with valve 428' in FIG. 7B. Alternatively, the valve can be disposed on the wall surface non-uniformly, such as several bumps or other shaped protrusions which are individually expandable and contractible. The individual protrusion-like valves are alternatively useable to selectively increase the surface to volume ratio in the interface layer 102. It should be noted that fixed or variable valves are also applicable to the embodiment shown in FIG. 6 although not shown.

In one embodiment, the expandable valve is a shape memory alloy or a differential thermal expansion element. In another embodiment, the expandable valve is a conventional or MEMS type valve. The expandable valve is alternatively made of a temperature driven bi-material which senses the temperature difference and automatically contracts or expands in response to the temperature difference. The expandable valve is alternatively made of a thermopneumatic material. The valve alternatively has a bladder configuration which contains expandable organic material having a high expansion coefficient. In another embodiment, the expandable valve is a capacitive valve which actively deflects between a contracted and expanded state to deliver or restrict the amount of fluid to a desired area.

As stated above, the cooling system 30, 30' (FIGS. 2A–2B) utilizes sensors 130 in the heat exchanger 100 to dynamically control the one or more pumps 32' (FIG. 2B) and/or valves inside or outside of the heat exchanger 100. As stated above, the heat source 99 alternatively has characteristics in which the locations of one or more of the hot spots change due to different tasks required to be performed by the heat source 99. In addition, the heat source 99 alternatively has characteristics in which the heat flux of the one or more of the hot spots change over time due to different tasks required to be performed by the heat source 99. The sensors 130 provide information to the control module 34 including, but not limited to, the flow rate of fluid flowing in the interface hot spot region, temperature of the interface layer 102 in the interface hot spot region and/or heat source 99 and temperature of the fluid.

To achieve temperature uniformity and effectively cool the heat source 99 in light of these spatial and temporal heat flux changes, the system 30, 30' includes a sensing and control module 34, 34' (FIGS. 2A–2B) which dynamically changes the amount of flow and/or flow rate of fluid entering the heat exchanger 100 in response to information provided by the sensors 130.

FIGS. 2A and 2B illustrate the heat exchanger 100 having multiple sensors 130, 130' placed within to sense the conditions of the heat source 99 as well as provide other information to the control module 34, 34'. In one embodiment, the one or mores sensors 130 are placed in the interface layer 102 and/or alternatively the heat source 99 at any desired location. As shown in FIGS. 2A–2B, the sensors 130, 130' and control module 34, 34' are also coupled to the one or more pumps 32' (FIGS. 2A–2B), whereby the information provided by the sensors 130 to the control module 34 actively controls the pump 32. The plurality of sensors 130' are coupled to the control module 34', whereby the control module 34' is preferably placed upstream from heat exchanger 100, as shown in FIGS. 2A–2B. Alternatively, the control module 34 is placed at any other location in the closed loop system 30. For instance, one pump 3' which is operating at a lower power will increase its output upon receiving information that a particular region in the interface layer 102 is increasing in temperature, thereby causing more fluid to be delivered to that particular region. In the case of multiple pumps 32' (FIG. 2B) coupled to one or more valves within or outside the heat exchanger 100, the sensors 130' and control module 38' alternatively control the flow of fluid to the desired interface hot spot regions via the one or more valves. For example, the expandable valve 426' shown in FIG. 7B can be configured to expand or contract in response to information provided by the sensors 130.

In addition to the above designs and methods employed within the system of the present invention, the heat exchanger 100 alternatively employs pressure-dependent boiling point conditions to achieve temperature uniformity and effective cooling of the hot spots in the heat source 99. Depending on the flow characteristics of the fluid in the heat exchanger 100, it is advantageous to subject the interface hot spot regions to fluid in the single, liquid phase or under two-phase, boiling conditions.

For single phase fluids, such as liquids, it is preferred that colder fluid is delivered at a high flow rate to the interface hot spot regions using the designs described above. For two phase fluids, such as a mixture of vapor and liquid, one method of effective cooling of the hot spots is to cause the fluid to boil at the hot spot to effectively cool the hot spot. It is well known that the temperature and boiling point of a two-phase fluid is directly proportional to the pressure of the fluid. In particular, as the amount of pressure in the fluid increases, the temperature and boiling point of the fluid increases. In contrast, as the amount of pressure decreases in the fluid, the temperature and boiling point of the fluid decreases. The heat exchanger 100 utilizes this pressure/temperature phenomenon of the fluid under single or two phase flow to effectively cool the hot spots and achieve temperature uniformity in the heat source 99.

For single phase flow, the heat exchanger 100 is configured to channel fluid that is a relatively low pressure and temperature to one or more desired interface hot spot regions, whereas the heat exchanger 100 simultaneously channels fluid to other parts of the interface layer 102 which is at a relatively higher pressure and temperature. The lower temperature fluid subjected to the hot spots will effectively cool the hot spots to a desired temperature while the higher temperature fluid will cool the warm or cold spots to the same desired temperature. In effect, the single phase flow achieves temperature uniformity in the heat source 99 by directing fluid at the adequate temperature to the desired locations in the interface layer 102 to effectively cool the locations to a desired temperature.

For two phase flow, the heat exchanger 100 of the present invention is configured to channel fluid using the same pressure-temperature phenomenon discussed above. In particular, the heat exchanger 100 of the present invention supplies lower pressure fluid to the interface hot spot regions to purposely create a pressure drop at the interface hot spot regions. It is well known that boiling of a two phase fluid causes a significant pressure drop due to a substantial increase in acceleration of the two phase fluid. As stated above regarding the pressure-temperature relationship, a significant drop in fluid pressure will naturally cause the temperature to significantly drop to a temperature corresponding with the reduced pressure. Accordingly, the heat exchanger 100 is configureable to channel two phase fluid already at a relatively lower pressure to the interface hot spot regions. In addition, the heat exchanger 100 is configureable to channel fluid at a relatively higher pressure to cooler areas of the interface layer 102. The lower pressure fluid, upon coming into contact with the interface hot spot region, will significantly heat up and begin to boil at a much lower boiling point, thereby generating a pressure drop. As a result of the decrease in pressure, the temperature of the boiling two phase fluid effectively decreases. As a result, the two phase fluid becomes cooler and is able to more effectively cool the hot spot. It is apparent that the same theory applies in the reversing two phase fluid into single phase fluid to achieve temperature uniformity in the heat source 99.

Figure 10:
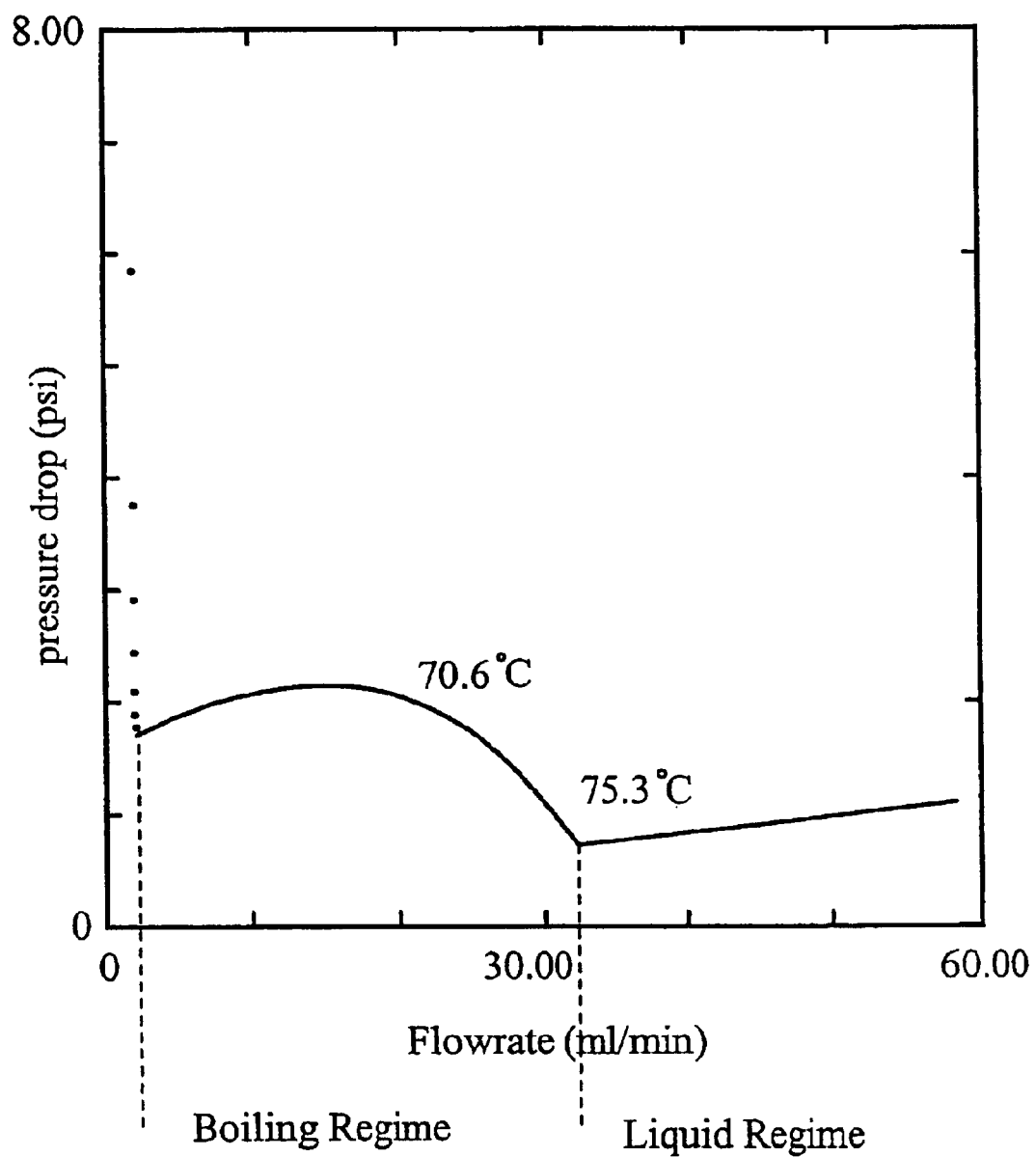
FIG. 10 illustrates a Pressure versus Flow Rate diagram of a fluid circulating through a heat exchanger.

In another embodiment, the heat exchanger 100 of the present invention achieves temperature uniformity along the entire heat source 99 using multiple operating points of single and two-phase fluids. FIG. 10 illustrates a graph of pressure drop versus flow rate of fluid in a typical heat exchanger coupled to a microprocessor chip. As shown in FIG. 10, the pressure of the fluid flowing along the interface layer 102 in the liquid region linearly increases with the flow rate. However, as the fluid flow rate decreases, the fluid undergoes enters the boiling regime and undergoes two-phase flow. As the fluid flow rate decreases in the boiling regime, the pressure of the fluid non-linearly increases. In addition, at significantly lower flow rates, the pressure of the fluid substantially increases in which the fluid at the significantly lower flow rates begins to dry up.

As stated above, the pressure of the fluid is directly proportional to the temperature of the fluid. In addition, as shown in FIG. 10, the pressure of the fluid has a relationship with the flow rate of the fluid. Thus, the temperature as well as the boiling point of the fluid is controllable by controlling the flow rate and/or pressure of the fluid.

The heat exchanger 100 of the present invention utilizes multiple fluid conditions to effectively achieve temperature uniformity in the heat source 99. The heat exchanger 100 is configureable to control the cooling effect of the fluid in each desired area by manipulating the fluid flow rate and/or the pressure of the fluid in the desired area using one pump 32 (FIG. 2A). Alternatively, heat exchanger 100 controls the cooling effect of the fluid in each desired area by manipulating the fluid flow rate and/or the pressure of the fluid in the desired area using multiple pumps 32' (FIG. 2B).

In particular, the heat exchanger 100 controls the pressure and/or flow rate of fluid in desired fluid paths to produce different desired effects in specific areas of the interface layer 102. In relation to the graph in FIG. 10, fluid which flows undergoing thermal exchange at a flow rate below 30 ml/min will undergo two phase flow. In contrast, the fluid flowing at a flow rate above 40 ml/min will be in the liquid regime and remain in single phase. For example, referring back to FIG. 5, the heat source 99 has a hot spot region in Location A and a warm spot region in Location B. In this particular example, the heat exchanger 200 does not allow fluid flowing in the interface hot spot region A to come into contact with fluid flowing in the interface hot spot region B. It is apparent to one skilled in the art that the several fluid paths do not need to be separated. Thus, the flow rate of all the fluid is increased and decreased as desired along the entire fluid path within the heat exchanger 100 by altering the hydraulic and thermal resistances in the heat exchanger 100. It should be noted that the discussion herein related to the heat exchanger 200 is for exemplary purposes and is applicable to any of the heat exchangers discussed as well as any number of hot/warm spots in the heat source 99.

As stated above regarding the pressure-temperature relationship, flow undergoing transition between single and two phase flow will decrease in temperature due to the pressure drop generated from the boiling of the fluid. Accordingly, the heat exchanger 200 channels two phase fluid to the interface hot spot region A and simultaneously channels single phase fluid to interface warm spot region B to bring the entire heat source 99 to a uniform temperature. The heat exchanger 200 in the present invention is able to accomplish this effect by channeling pressurized fluid at a lower flow rate to interface hot spot region A and channeling fluid at the same pressure to interface warm spot region B at a higher flow rate. In the present example, the heat exchanger 200 channels fluid at 1 psi to the interface hot spot region A at a flow rate of 20 ml/min, whereby the fluid has two phase characteristics. Simultaneously, the heat exchanger 200 channels fluid at 1 psi to interface warm spot region B at a flow rate of 40 ml/min, whereby the fluid has single phase characteristics.

The flow rate of the fluid is controlled by using any of the designs and methods discussed above relating to hydraulic resistance. For instance, the heat transferring features in the interface layer 102 support different flow rates by controlling the fluid flow along the interface layer 102. Additionally, configurations in the fingers, channels and/or apertures are alternatively optimized to control the flow rate of the fluid. Alternatively, the heat exchanger 100 is configured to provide more effective heat transfer to the fluid using any of the methods and designs discussed above regarding controlling the thermal resistance upon the fluid flow. Alternatively, the heat exchanger 100 is coupled to more than one pump, whereby the multiple pumps 32' circulate independent fluid loops which have different operating conditions in the heat exchanger 100. It is also noted that the same phenomena applies to the heat exchanger 100 keeping the flow rate of the fluid constant whereas the pressure of the desired fluid paths are altered or controlled to achieve the same effects.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A method of controlling temperature of a heat source in contact with a heat exchanging surface of a heat exchanger, wherein the heat exchanging surface is substantially aligned along a plane, the method comprising:
    a. channeling a selectable, non-uniform amount of a first temperature fluid to one or more predetermined locations on the heat exchanging surface, wherein the first temperature fluid undergoes thermal exchange with the heat source along the heat exchanging surface; and
    b. channeling a second temperature fluid from the heat exchange surface, wherein fluid is channeled to minimize temperature differences along the heat source.

2. The method according to claim 1 wherein the fluid is in single phase flow conditions.

3. The method according to claim 1 wherein the fluid is in two phase flow conditions.

4. The method according to claim 1 wherein at least a portion of the fluid undergoes a transition between single and two phase flow conditions in the heat exchanger.

5. The method according to claim 1 wherein the first temperature fluid and the second temperature fluid are channeled substantially perpendicular to the plane.

6. The method according to claim 1 further comprising channeling the fluid along at least one fluid path configured to apply a desired fluidic resistance to the fluid to control the fluid at a desired temperature.

7. The method according to claim 6 wherein the fluid is channeled along one or more fluid paths, wherein each fluid path includes a flow length dimension and a hydraulic dimension.

8. The method according to claim 7 wherein the hydraulic dimension of the fluid path varies with respect to the flow length dimension.

9. The method according to claim 8 further comprising configuring the hydraulic dimension to be adjustable in response to one or more operating conditions in the heat exchanger, wherein the adjustable hydraulic dimension is configured to control the fluidic resistance.

10. The method according to claim 7 further comprising coupling means for sensing at least one desired characteristic at a predetermined location along the fluid path.

11. The method according to claim 1 further comprising:
    a. directing a first portion of the fluid to a first circulation path along a first desired region of the heat exchanging surface; and
    b. directing a second portion of the fluid to a second circulation path along a second desired region of the heat exchanging surface, wherein the first circulation path flows independently of the second circulation path to minimize temperature differences in the heat source.

12. The method according to claim 7 further comprising configuring one or more selected areas in the heat exchange surface to have a desired thermal conductivity to control a local thermal resistance.

13. The method according to claim 7 further comprising configuring the heat exchange surface to include a plurality of heat transferring features thereupon, wherein heat is transferred between the fluid and the plurality of heat transferring features.

14. The method according to claim 7 further comprising roughening at least a portion of the heat exchange surface to a desired roughness to control at least one of the fluidic and thermal resistances.

15. The method according to claim 13 wherein at least one of the heat transferring features further comprises a pillar.

16. The method according to claim 13 wherein the at least one heat transferring feature further comprises a microchannel.

17. The method according to claim 13 wherein the at least one heat transferring feature further comprises a microporous structure.

18. The method according to claim 15 wherein the at least one pillar has an area dimension within the range of and including $(10\ \text{micron})^2$ and $(100\ \text{micron})^2$.

19. The method according to claim 15 wherein the at least one pillar has a height dimension within the range of and including 50 microns and 2 millimeters.

20. The method according to claim 15 wherein at least two pillars are separate from each other by a spacing dimension within the range of and including 10 to 150 microns.

21. The method according to claim 16 wherein the at least one microchannel has an area dimension within the range of and including $(10\ \text{micron})^2$ and $(100\ \text{micron})^2$.

22. The method according to claim 16 wherein the at least one microchannel has a height dimension within the range of and including 50 microns and 2 millimeters.

23. The method according to claim 16 wherein at least two microchannels are separate from each other by a spacing dimension within the range of and including 10 to 150 microns.

24. The method according to claim 16 wherein the at least one microchannel has a width dimension within the range of and including 10 to 150 microns.

25. The method according to claim 17 wherein the microporous structure has a porosity within the range of and including 50 to 80 percent.

26. The method according to claim 17 wherein the microporous structure has an average pore size within the range of and including 10 to 200 microns.

27. The method according to claim 17 wherein the microporous structure has a height dimension within the range of and including 0.25 to 2.00 millimeters.

28. The method according to claim 13 wherein a desired number of heat transferring features are disposed per unit area to control a resistance to the fluid.

29. The method according to claim 28 wherein the fluidic resistance is optimized by selecting an appropriate pore size and an appropriate pore volume fraction in a microporous structure.

30. The method according to claim 28 wherein the fluidic resistance is optimized by selecting an appropriate number of pillars and an appropriate pillar volume fraction in the unit area.

31. The method according to claim 28 wherein the fluidic resistance is optimized by selecting an appropriate hydraulic diameter for at least one microchannel.

32. The method according to claim 17 wherein the fluidic resistance is optimized by selecting an appropriate porosity of the microporous structure.

33. The method according to claim 15 wherein the fluidic resistance is optimized by selecting an appropriate spacing dimension between at least two pillars.

34. The method according to claim 13 further comprising optimizing a length dimension of the heat transferring feature to control the fluidic resistance to the fluid.

35. The method according to claim 13 further comprising optimizing at least one dimension of at least a portion of the heat transferring feature to control the fluidic resistance to the fluid.

36. The method according to claim 13 further comprising optimizing a distance between two or more heat transferring features to control the fluidic resistance to the fluid.

37. The method according to claim 13 further comprising applying a coating upon at least a portion of at least one heat transferring feature in the plurality to control at least one of the thermal and fluidic resistances.

38. The method according to claim 13 further comprising optimizing a surface area of at least one heat transferring feature to control the fluidic resistance to the fluid.

39. The method according to claim 13 further comprising configuring at least one flow impeding element along the fluid path, wherein the at least one flow impeding element controls a resistance.

40. The method according to claim 7 further comprising adjusting a pressure of the fluid at a predetermined location along the fluid path to control an instantaneous temperature of the fluid.

41. The method according to claim 7 further comprising adjusting a flow rate of the fluid at a predetermined location along the flow path to control an instantaneous temperature of the fluid.

42. A heat exchanger for controlling a heat source temperature comprising:
   a. a first layer in substantial contact with the heat source and configured to perform thermal exchange with fluid flowing in the first layer, the first layer aligned along a first plane; and
   b. a second layer coupled to the first layer for channeling fluid to the first layer and for channeling fluid from the first layer, wherein the heat exchanger is configured to minimize temperature differences along the heat source.

43. The heat exchanger according to claim 42 wherein the second layer further comprises:
   a. a plurality of inlet fluid paths configured substantially perpendicular to the first plane; and
   b. a plurality of outlet paths configured substantially perpendicular to the first plane, wherein the inlet and outlet paths are arranged parallel with one another.

44. The heat exchanger according to claim 42 wherein the second layer further comprises:
   a. a plurality of inlet fluid paths configured substantially perpendicular to the first plane; and
   b. a plurality of outlet paths configured substantially perpendicular to the first plane, wherein the inlet and outlet paths are arranged in non-parallel relation with one another.

45. The heat exchanger according to claim 42 wherein the second layer further comprises:
   a. a first level having at least one first port configured to channel fluid to the first level; and
   b. a second level having at least one second port, the second level configured to channel fluid from the first level to the second port, wherein fluid in the first level flows separately from the fluid in the second level.

46. The heat exchanger according to claim 42 wherein the fluid is in single phase flow conditions.

47. The heat exchanger according to claim 42 wherein the fluid is in two phase flow conditions.

48. The heat exchanger according to claim 42 wherein at least a portion of the fluid undergoes a transition between single and two phase flow conditions in the heat exchanger.

49. The heat exchanger according to claim 42 further comprising at least one fluid path configured to apply a desired fluidic resistance to the fluid to control temperature of the fluid at a desired location.

50. The heat exchanger according to claim 49 wherein the at least one fluid path is located in the first layer.

51. The heat exchanger according to claim 49 wherein the at least one fluid path is located in the second layer.

52. The heat exchanger according to claim 49 wherein the at least one fluid path is located in a third layer positioned in between the first and second layers.

53. The heat exchanger according to claim 49 wherein the fluid path includes a flow length dimension and a hydraulic dimension.

54. The heat exchanger according to claim 53 wherein the hydraulic dimension is nonuniform with respect to the flow length dimension at a desired location to control the fluidic resistance to the fluid.

55. The heat exchanger according to claim 49 further comprising at least one expandable valve coupled to a wall of the fluid path, wherein the at least one expandable valve is configured to adjust in response to one or more operating conditions to variably control the fluidic resistance.

56. The heat exchanger according to claim 49 further comprising one or more sensors positioned at a predetermined location along the fluid path, wherein the one or more sensors provide information regarding the temperature of the heat source.

57. The heat exchanger according to claim 49 wherein a portion of the fluid path is directed to a first circulation path along the first layer, wherein fluid in the first circulation path flows independently of fluid in a second circulation path in the first layer.

58. The heat exchanger according to claim 49 wherein one or more selected areas in the first layer is configured to have a desired thermal conductivity to control a thermal resistance to the fluid.

59. The heat exchanger according to claim 49 wherein the first layer further comprises a plurality of heat transferring features disposed thereupon.

60. The heat exchanger according to claim 59 wherein at least one of the heat transferring features further comprises a pillar.

61. The heat exchanger according to claim 59 wherein the at least one heat transferring features further comprises a microchannel.

62. The heat exchanger according to claim 59 wherein the at least one heat transferring features further comprises a microporous structure.

63. The heat exchanger according to claim 60 wherein the at least one pillar has an area dimension within the range of and including (10 micron)$^2$ and (100 micron)$^2$.

64. The heat exchanger according to claim 60 wherein the at least one pillar has a height dimension within the range of and including 50 microns and 2 millimeters.

65. The heat exchanger according to claim 60 wherein at least two pillars are separate from each other by a spacing dimension within the range of and including 10 to 150 microns.

66. The heat exchanger according to claim 61 wherein the at least one microchannel has an area dimension within the range of and including (10 micron)$^2$ and (100 micron)$^2$.

67. The heat exchanger according to claim 61 wherein the at least one microchannel has a height dimension within the range of and including 50 microns and 2 millimeters.

68. The heat exchanger according to claim 61 wherein at least two microchannels are separate from each other by a spacing dimension within the range of and including 10 to 150 microns.

69. The heat exchanger according to claim 61 wherein the at least one microchannel has a width dimension within the range of and including 10 to 150 microns.

70. The heat exchanger according to claim 62 wherein the microporous structure has a porosity within the range of and including 50 to 80 percent.

71. The heat exchanger according to claim 62 wherein the microporous structure has an average pore size within the range of and including 10 to 200 microns.

72. The heat exchanger according to claim 62 wherein the microporous structure has a height dimension within the range of and including 0.25 to 2.00 millimeters.

73. The heat exchanger according to claim 59 wherein at least a portion of the first layer is configured to have a desired roughness to control the fluidic resistance.

74. The heat exchanger according to claim 59 wherein a desired number of heat transferring features are disposed per unit area to control the fluidic resistance to the fluid.

75. The heat exchanger according to claim 59 wherein a length dimension of at least one heat transferring feature is configured to control the fluidic resistance to the fluid.

76. The heat exchanger according to claim 59 wherein a height dimension of the heat transferring feature is configured to control the fluidic resistance to the fluid.

77. The heat exchanger according to claim 59 wherein one or more heat transferring features are positioned an appropriate distance from an adjacent heat transferring feature to control the fluidic resistance to the fluid.

78. The heat exchanger according to claim 59 wherein at least a portion of at least one heat transferring feature includes a coating thereupon, wherein the coating controls the thermal resistance to the fluid.

79. The heat exchanger according to claim 59 wherein at least one heat transferring feature is configured to have an appropriate surface area to control the fluidic resistance to the fluid.

80. The heat exchanger according to claim 49 wherein the fluid path further comprises at least one flow impeding element extending into the fluid path to control the fluidic resistance to the fluid.

81. The heat exchanger according to claim 49 wherein the fluid path is configured to adjust a fluid pressure at a predetermined location to control a temperature of the fluid.

82. The heat exchanger according to claim 49 wherein the fluid path adjusts a pressure of the fluid at a desired location to control an instantaneous temperature of the fluid.

83. The heat exchanger according to claim 49 wherein the fluid path adjusts a flow rate of at least a portion of the fluid to control a temperature of the fluid.

84. A hermetic closed loop system for controlling a temperature of a heat source comprising:
   a. at least one heat exchanger for controlling the temperature of the heat source by channeling selectable, non-uniform amounts of a fluid to one or more predetermined locations on the heat source, wherein the heat exchanger is configured to minimize temperature differences in the heat source;
   b. at least one pump for circulating fluid throughout the loop, the at least one pump coupled to the at least one heat exchanger; and
   c. at least one heat rejector coupled to the at least one pump and the at least one heat exchanger.

85. The system according to claim 84 wherein the at least one heat exchanger layer further comprises:
   a. an interface layer in substantial contact with the heat source and configured to channel fluid along at least one thermal exchange path, the interface layer configured along a first plane; and
   b. a manifold layer for delivering inlet fluid along at least one inlet path and for removing outlet fluid along at least one outlet path.

86. The system according to claim 85 wherein the manifold layer further comprises:
   a. a plurality of inlet fingers in communication with the inlet fluid paths, the plurality of inlet fingers configured substantially perpendicular to the first plane; and
   b. a plurality of outlet fingers in communication with the outlet fluid paths, the plurality of outlet fingers configured substantially perpendicular to the first plane, wherein the inlet and outlet fingers are arranged parallel with one another.

87. The system according to claim 85 wherein the manifold layer further comprises:
   a. a plurality of inlet fingers in communication with the inlet fluid paths, the plurality of inlet fingers configured substantially perpendicular to the first plane; and
   b. a plurality of outlet fingers in communication with the outlet fluid paths, the plurality of outlet fingers configured substantially perpendicular to the first plane, wherein the inlet and outlet fingers are arranged in non-parallel relation with one another.

88. The system according to claim 85 wherein the manifold layer further comprises:
   a. a first level having a plurality of fluid paths positioned an optimal distance from one another; and
   b. a second level configured to channel fluid from the outlet fluid paths to the second port, wherein fluid in the first level flows separately from the fluid in the second level.

89. The system according to claim 84 wherein the fluid is in single phase flow conditions.

90. The system according to claim 84 wherein the fluid is in two phase flow conditions.

91. The system according to claim 84 wherein at least a portion of the fluid undergoes a transition between single and two phase flow conditions in the heat exchanger.

92. The system according to claim 85 wherein the heat exchanger applies a fluidic resistance to the fluid to control a flow rate of the fluid at a desired location in the heat exchanger.

93. The system according to claim 92 wherein each inlet fluid path and outlet fluid path includes a respective flow length dimension and a hydraulic dimension.

94. The system according to claim 93 wherein the hydraulic dimension is nonuniform with respect to the flow length dimension to control the fluidic resistance to the fluid.

95. The system according to claim 92 further comprising at least one expandable valve coupled along a wall within the heat exchanger, wherein the at least one expandable valve is configured to be adjustable in response to one or more operating conditions to variably control the fluidic resistance to the fluid.

96. The system according to claim 84 further comprising one or more sensors positioned at a predetermined location in the heat exchanger, wherein the one or more sensors provide information regarding cooling of the heat source.

97. The system according to claim 85 wherein a portion of the inlet fluid path is directed to a first circulation path along the interface layer, wherein fluid in the first circulation path flows independently of fluid in a second circulation path in the interface layer.

98. The system according to claim 92 wherein one or more selected areas in the interface layer is configured to have a desired thermal conductivity to control the thermal resistance to the fluid.

99. The system according to claim 92 wherein the interface layer further comprises a plurality of heat transferring features disposed thereupon.

100. The system according to claim 99 wherein at least one of the heat transferring features further comprises a pillar.

101. The system according to claim 99 wherein the at least one heat transferring features further comprises a microchannel.

102. The system according to claim 99 wherein the at least one heat transferring features further comprises a microporous structure.

103. The system according to claim 100 wherein the at least one pillar has an area dimension within the range of and including (10 micron)$^2$ and (100 micron)$^2$.

104. The system according to claim 100 wherein the at least one pillar has a height dimension within the range of and including 50 microns and 2 millimeters.

105. The system according to claim 100 wherein at least two pillars are separate from each other by a spacing dimension within the range of and including 10 to 150 microns.

106. The system according to claim 101 wherein the at least one microchannel has an area dimension within the range of and including (10 micron)$^2$ and (100 micron)$^2$.

107. The system according to claim 101 wherein the at least one microchannel has a height dimension within the range of and including 50 microns and 2 millimeters.

108. The system according to claim 101 wherein at least two microchannels are separate from each other by a spacing dimension within the range of and including 10 to 150 microns.

109. The system according to claim 101 wherein the at least one microchannel has a width dimension within the range of and including 10 to 150 microns.

110. The system according to claim 102 wherein the microporous structure has a porosity within the range of and including 50 to 80 percent.

111. The system according to claim 102 wherein the microporous structure has an average pore size within the range of and including 10 to 200 microns.

112. The system according to claim 102 wherein the microporous structure has a height dimension within the range of and including 0.25 to 2.00 millimeters.

113. The system according to claim 99 wherein at least a portion of the interface layer is configured to have a desired roughness to control the fluidic resistance to the fluid.

114. The system according to claim 99 wherein a desired number of heat transferring features are disposed per unit area to control the fluidic resistance to the fluid.

115. The system according to claim 99 wherein a length dimension of at least one heat transferring feature is configured to control the fluidic resistance to the fluid.

116. The system according to claim 99 wherein a height dimension of the heat transferring feature is configured to control the fluidic resistance to the fluid.

117. The system according to claim 99 wherein one or more heat transferring features are positioned an appropriate distance from an adjacent heat transferring feature to control the fluidic resistance to the fluid.

118. The system according to claim 99 wherein at least a portion of at least one heat transferring feature includes a coating thereupon, wherein the coating provides a desired amount of fluidic resistance to the fluid.

119. The system according to claim 99 wherein at least one heat transferring feature is configured to have an appropriate surface area to control the fluidic resistance to the fluid.

120. The system according to claim 92 wherein at least one fluid path further comprises at least one flow impeding element extending into the fluid path to control the fluidic resistance to the fluid.

121. The system according to claim 92 wherein at least one of the inlet and outlet paths is configured to adjust a fluid pressure along a predetermined location along a flow path to control a temperature of the fluid.

122. The system according to claim 92 wherein at least one of the inlet and outlet paths adjusts a pressure of the fluid at a desired location to control a temperature of the fluid.

123. The system according to claim 92 wherein at least one of the inlet and outlet paths adjusts a flow rate of at least a portion of the fluid to control a temperature of the fluid.

124. A heat exchanger for controlling a heat source temperature comprising:
  a. a first layer in substantial contact with the heat source and configured to perform thermal exchange with fluid flowing in the first layer, the first layer aligned along a first plane; and
  b. a second layer coupled to the first layer for channeling selectable amounts of fluid to one or more predetermined locations within the first layer and for channeling fluid from the first layer, wherein the one or more predetermined locations within the first layer correspond to one or more predetermined locations on the heat source, further wherein the heat exchanger is configured to minimize temperature differences along the heat source, wherein the heat exchanger corresponds to one heat source.

125. The heat exchanger according to claim 124 wherein the second layer further comprises:
  c. a plurality of inlet fluid paths configured substantially perpendicular to the first plane; and
  d. a plurality of outlet paths configured substantially perpendicular to the first plane, wherein the inlet and outlet paths are arranged parallel with one another.

126. The heat exchanger according to claim 124 wherein the second layer further comprises:
  e. a plurality of inlet fluid paths configured substantially perpendicular to the first plane; and
  f. a plurality of outlet paths configured substantially perpendicular to the first plane, wherein the inlet and outlet paths are arranged in non-parallel relation with one another.

127. The heat exchanger according to claim 124 wherein the second layer further comprises:
   g. a first level having at least one first port configured to channel fluid to the first level; and
   h. a second level having at least one second port, the second level configured to channel fluid from the first level to the second port, wherein fluid in the first level flows separately from the fluid in the second level.

128. The heat exchanger according to claim 124 wherein the fluid is in single phase flow conditions.

129. The heat exchanger according to claim 124 wherein the fluid is in two phase flow conditions.

130. The heat exchanger according to claim 124 wherein at least a portion of the fluid undergoes a transition between single and two phase flow conditions in the heat exchanger.

131. The heat exchanger according to claim 124 further comprising at least one fluid path configured to apply a desired fluidic resistance to the fluid to control temperature of the fluid at a desired location.

132. The heat exchanger according to claim 131 wherein the at least one fluid path is located in the first layer.

133. The heat exchanger according to claim 131 wherein the at least one fluid path is located in the second layer.

134. The heat exchanger according to claim 131 wherein the at least one fluid path is located in a third layer positioned in between the first and second layers.

135. The heat exchanger according to claim 131 wherein the fluid path includes a flow length dimension and a hydraulic dimension.

136. The heat exchanger according to claim 135 wherein the hydraulic dimension is nonuniform with respect to the flow length dimension at a desired location to control the fluidic resistance to the fluid.

137. The heat exchanger according to claim 131 further comprising at least one expandable valve coupled to a wall of the fluid path, wherein the at least one expandable valve is configured to adjust in response to one or more operating conditions to variably control the fluidic resistance.

138. The heat exchanger according to claim 131 further comprising one or more sensors positioned at a predetermined location along the fluid path, wherein the one or more sensors provide information regarding the temperature of the heat source.

139. The heat exchanger according to claim 131 wherein a portion of the fluid path is directed to a first circulation path along the first layer, wherein fluid in the first circulation path flows independently of fluid in a second circulation path in the first layer.

140. The heat exchanger according to claim 131 wherein one or more selected areas in the first layer is configured to have a desired thermal conductivity to control a thermal resistance to the fluid.

141. The heat exchanger according to claim 131 wherein the first layer further comprises a plurality of heat transferring features disposed thereupon.

142. The heat exchanger according to claim 141 wherein at least one of the heat transferring features further comprises a pillar.

143. The heat exchanger according to claim 141 wherein the at least one heat transferring features further comprises a microchannel.

144. The heat exchanger according to claim 141 wherein the at least one heat transferring features further comprises a microporous structure.

145. The heat exchanger according to claim 142 wherein the at least one pillar has an area dimension within the range of and including $(10 \text{ micron})^2$ and $(100 \text{ micron})^2$.

146. The heat exchanger according to claim 142 wherein the at least one pillar has a height dimension within the range of and including 50 microns and 2 millimeters.

147. The heat exchanger according to claim 142 wherein at least two pillars are separate from each other by a spacing dimension within the range of and including 10 to 150 microns.

148. The heat exchanger according to claim 143 wherein the at least one microchannel has an area dimension within the range of and including $(10 \text{ micron})^2$ and $(100 \text{ micron})^2$.

149. The heat exchanger according to claim 143 wherein the at least one microchannel has a height dimension within the range of and including 50 microns and 2 millimeters.

150. The heat exchanger according to claim 143 wherein at least two microchannels are separate from each other by a spacing dimension within the range of and including 10 to 150 microns.

151. The heat exchanger according to claim 143 wherein the at least one microchannel has a width dimension within the range of and including 10 to 150 microns.

152. The heat exchanger according to claim 143 wherein the microporous structure has a porosity within the range of and including 50 to 80 percent.

153. The heat exchanger according to claim 144 wherein the microporous structure has an average pore size within the range of and including 10 to 200 microns.

154. The heat exchanger according to claim 144 wherein the microporous structure has a height dimension within the range of and including 0.25 to 2.00 millimeters.

155. The heat exchanger according to claim 141 wherein at least a portion of the first layer is configured to have a desired roughness to control the fluidic resistance.

156. The heat exchanger according to claim 141 wherein a desired number of heat transferring features are disposed per unit area to control the fluidic resistance to the fluid.

157. The heat exchanger according to claim 141 wherein a length dimension of at least one heat transferring feature is configured to control the fluidic resistance to the fluid.

158. The heat exchanger according to claim 141 wherein a height dimension of the heat transferring feature is configured to control the fluidic resistance to the fluid.

159. The heat exchanger according to claim 141 wherein one or more heat transferring features are positioned an appropriate distance from an adjacent heat transferring feature to control the fluidic resistance to the fluid.

160. The heat exchanger according to claim 141 wherein at least a portion of at least one heat transferring feature includes a coating thereupon, wherein the coating controls the thermal resistance to the fluid.

161. The heat exchanger according to claim 141 wherein at least one heat transferring feature is configured to have an appropriate surface area to control the fluidic resistance to the fluid.

162. The heat exchanger according to claim 131 wherein the fluid path further comprises at least one flow impeding element extending into the fluid path to control the fluidic resistance to the fluid.

163. The heat exchanger according to claim 131 wherein the fluid path is configured to adjust a fluid pressure at a predetermined location to control a temperature of the fluid.

164. The heat exchanger according to claim 131 wherein the fluid path adjusts a pressure of the fluid at a desired location to control an instantaneous temperature of the fluid.

165. The heat exchanger according to claim 131 wherein the fluid path adjusts a flow rate of at least a portion of the fluid to control a temperature of the fluid.

* * * * *

UNITED STATES PATENT AND TRADEMARK OFFICE
CERTIFICATE OF CORRECTION

| | | |
|---|---|---|
| PATENT NO. | : 7,104,312 B2 | Page 1 of 1 |
| APPLICATION NO. | : 10/698304 | |
| DATED | : September 19, 2006 | |
| INVENTOR(S) | : Kenneth Goodson et al. | |

It is certified that error appears in the above-identified patent and that said Letters Patent is hereby corrected as shown below:

On Title Page item 56
IN THE REFERENCES CITED - OTHER PUBLICATIONS - p. 4

Col. 1, Line 45
Please replace "Jerry K. Keskn, Ph.D." with --Jerry K. Keska, Ph.D.-- The name is shown correctly in the Information Disclosure Statement mailed on April 30, 2004.

IN THE CLAIMS - COLUMN 23, LINE 59, CLAIM 42(B)

Please replace:
"a second layer coupled to the first layer for channeling fluid to the first layer and for channeling fluid from the first layer, wherein the heat exchanger is configured to minimize temperature differences along the heat source"
with:
--a second layer coupled to the first layer for channeling selectable, non-uniform amounts of fluid to one or more predetermined locations within the first layer and for channeling fluid from the first layer, wherein the one of more predetermined locations within the first layer correspond to one or more predetermined locations on the heat source, further wherein the heat exchanger is configured to minimize temperature differences along the heat source.--

Signed and Sealed this

Nineteenth Day of December, 2006

JON W. DUDAS
*Director of the United States Patent and Trademark Office*